(12) United States Patent
Weisensee et al.

(10) Patent No.: US 11,578,929 B2
(45) Date of Patent: Feb. 14, 2023

(54) PASSIVE AND COMPACT LIQUID METAL HEAT SWITCH

(71) Applicants: Patricia Weisensee, St. Louis, MO (US); Mehran Abolghasemibizaki, St. Louis, MO (US); Junhui Li, St. Louis, MO (US)

(72) Inventors: Patricia Weisensee, St. Louis, MO (US); Mehran Abolghasemibizaki, St. Louis, MO (US); Junhui Li, St. Louis, MO (US)

(73) Assignee: Washington University, St. Louis, MO (US)

( * ) Notice: Subject to any disclaimer, the term of this patent is extended or adjusted under 35 U.S.C. 154(b) by 30 days.

(21) Appl. No.: 17/374,916

(22) Filed: Jul. 13, 2021

(65) Prior Publication Data
US 2022/0042754 A1    Feb. 10, 2022

Related U.S. Application Data

(60) Provisional application No. 63/051,377, filed on Jul. 13, 2020.

(51) Int. Cl.
*F28F 27/00*        (2006.01)
*F28F 13/00*        (2006.01)

(52) U.S. Cl.
CPC ........ *F28F 13/00* (2013.01); *F28F 2013/008* (2013.01)

(58) Field of Classification Search
CPC ............................ F28F 13/00; F28F 2013/008

USPC ........................................................... 165/96
See application file for complete search history.

(56) References Cited

U.S. PATENT DOCUMENTS

| | | | |
|---|---|---|---|
| 2007/0171609 A1* | 7/2007 | Kehl | H05K 7/20181 361/690 |
| 2011/0120075 A1* | 5/2011 | Diaz | F02K 1/822 60/39.11 |
| 2013/0068973 A1* | 3/2013 | van Ruth | F16K 31/16 137/565.11 |
| 2021/0112315 A1* | 4/2021 | Mays | G02B 6/4268 |

* cited by examiner

*Primary Examiner* — Davis D Hwu
(74) *Attorney, Agent, or Firm* — Michael G. McCay

(57) ABSTRACT

A passive heat switch device is disclosed that includes a casing defining a closed channel, as well as a passive thermal actuator and liquid slug positioned inside the closed channel. The closed channel includes a heat conducting region made of a heat conducting material and an insulating region made of an insulating material. The passive thermal actuator is thermally coupled to the heat conducting material of the heat conducting region and extends into the insulating region of the closed channel. The passive thermal actuator deforms when an actuator temperature falls within a switching temperature range. The liquid slug is positioned within the closed channel and contacts at least a portion of the passive thermal actuator and the closed channel and is configured to move along the closed channel between the insulating region and the thermally conductive region in response to deformation of the passive thermal actuator.

20 Claims, 19 Drawing Sheets
(16 of 19 Drawing Sheet(s) Filed in Color)

PASSIVE AND COMPACT LIQUID METAL HEAT SWITCH

CROSS-REFERENCE TO RELATED APPLICATIONS

This application claims the benefit of U.S. Provisional Application No. 63/051,377 filed Jul. 13, 2020, the contents of which are incorporated by reference in its entirety.

STATEMENT REGARDING FEDERALLY SPONSORED RESEARCH & DEVELOPMENT

This invention was made with government support under 80NSSC20K0072 awarded by the National Aeronautics and Space Administration. The government has certain rights in the invention.

FIELD OF THE INVENTION

The present disclosure generally relates to passive heat switch devices.

BACKGROUND

Thermal switches are an integral part of thermal management systems for a variety of different applications such as the thermal management of spacecraft, rovers, electric vehicles, buildings, and many other applications. Thermal switches are able to manipulate the flow of thermal energy (heat), between a warm source and a cold sink. Thermal switches may be used to passively control the temperatures of electronics, instrumentation, human facilities on a spacecraft, building interiors, and other systems, structures, and devices by switching between a thermally conductive "ON" configuration corresponding to relatively high thermal conductivity, and a thermally non-conductive "OFF" configuration, corresponding to relatively high thermal insulation, depending on the external temperature or applied thermal loads. For example, environmental temperatures on the moon vary between about −180 and +130° C. during the lunar diurnal cycle, but internal spacecraft temperatures are maintained in a much narrower range (typically near room temperature). Sophisticated thermal management technologies, in particular the advancement of heat switches, are indispensable for a wide variety of applications.

One parameter used to characterize the performance of a heat switch is conductance, or switching ratio (SR), defined herein as the ratio of the switch's thermal conductances C in the thermally conductive (ON) state and thermally non-conductive (OFF) states: $SR=C_{on}/C_{off}$. A high switching ratio, a low specific mass, and a small volumetric footprint are typically desirable characteristics of thermal switches.

Existing designs of passive heat switches include phase-change switches, gas-gap switches, and thermo-mechanical switches. Paraffin switches, the most common type of passive heat switch, are robust, scalable, and have achieved switching ratios up to 130:1, but require movement of a metallic structure to close the switch, necessitating complicated support systems to maintain the structural integrity of the switch, resulting in relatively bulky and heavy switch assemblies, with thicknesses of up to 7 cm and masses of up to 660 g. Gas-gap switches have demonstrated switching ratios up to 2500:1 in cryogenic applications, but are not amenable to scaling to different temperature ranges and coverage areas. Thermo-mechanical switches are capable of switching ratios in excess of >2000:1, but many thermo-mechanical switches, like paraffin-based switches, typically require complex and bulky support structures. Other promising technologies such as electrostatic or electrowetting-on-dielectric-based thermal switches have the potential to achieve switching ratios up to 1000:1, but require active actuation.

SUMMARY

Among the various aspects of the present disclosure is the provision of a passive heat switch device. The device includes a casing defining a closed channel, as well as a passive thermal actuator and liquid slug positioned inside the closed channel. The casing includes a pair of opposed lateral sides comprising an insulating material and opposed upper and lower sides, the lateral sides, upper side, and lower side defining a closed channel. The closed channel includes a heat conducting region and an insulating region. The heat conducting region includes a first portion of the upper and lower sides made of a heat conducting material. The insulating region includes a second portion of the upper and lower sides each made of the insulating material. The passive thermal actuator is thermally coupled to the first portion of the upper side and extends into the insulating region of the closed channel. The passive thermal actuator is configured to deform when an actuator temperature of at least a portion of the passive thermal actuator falls within a switching temperature range defined between a minimum switching temperature and a maximum switching temperature. The liquid slug is positioned within the closed channel and contacts at least a portion of the passive thermal actuator and a portion of the lower side. The liquid slug is configured to move along the closed channel in response to the deformation of the passive thermal actuator. The movement of the liquid slug ranges between the insulating region and the thermally conductive region of the closed channel over the switching temperature range.

In some aspects, the position of the liquid slug is within the insulating region of the closed channel when the actuator temperature is above the maximum switching temperature and within the thermally conductive region when the actuator temperature is below the minimum switching temperature; or the position of the liquid slug is within the insulating region of the closed channel when the actuator temperature is below the minimum switching temperature and within the thermally conductive region when the actuator temperature is above the maximum switching temperature In some aspects, the passive thermal actuator is a bimetallic strip with opposed fixed and free ends, in which the fixed end is thermally coupled to the first portion of the upper side and the free end is positioned within the insulating region of the closed channel. In some aspects, deforming the bimetallic strip modulates a separation distance of the free end from the lower side of the closed channel relative to the separation distance of an undeformed bimetallic strip. In some aspects, deforming the bimetallic strip moves the free end upward from the lower side of the closed channel and increases the separation distance; or deforming the bimetallic strip moves the free end downward toward the lower side of the closed channel and decreases the separation distance. In some aspects, deforming the bimetallic strip induces a Laplace pressure differential on the liquid slug, causing movement of the liquid slug along the closed channel. In some aspects, the heat conducting materials of the first portion of the upper and lower sides are thermally isolated when the liquid slug is positioned in the insulating region of the channel. In some aspects, the heat conducting materials of the first portion of the upper and lower sides are thermally coupled when the liquid slug is positioned in the heat conducting region of the channel. In some aspects, a heat source is coupled to the heat conducting material of the first portion of the upper side, a heat sink is thermally coupled to the heat conducting material of the first portion of the lower side, or any combination thereof; or a heat source is coupled to the heat conducting material of the first portion of the lower side, a heat sink is thermally coupled to the heat conducting material of the first portion of the upper side, or any combination thereof. In some aspects, the insulating material includes an insulating polymer, an insulating ceramic, or any combination thereof. In some aspects, the insulating material includes polyetheretherketone (PEEK), an acrylic, an alumina ceramic, a zirconia ceramic, and any combination thereof. In some aspects, wherein the heat conducting material includes a metal, a thermally conductive ceramic, graphite, and any combination thereof. In some aspects, the metal is selected from copper, aluminum, silver, gold, iron, magnesium, zinc, tungsten, molybdenum, steel, and any combination or alloy thereof. In some aspects, the thermally conductive ceramic is selected from Shapal, Boron Nitride, and any combination thereof. In some aspects, the liquid slug is made up of a material with a melting point below a minimum operating temperature of the passive heat switch device. In some aspects, the liquid slug is a liquid metal. In some aspects, the liquid metal is selected from mercury, gallium, a gallium alloy, an indium alloy, a bismuth-based metal, and any combination thereof. In some aspects, the liquid metal is selected from Galinstan, EGaIn, gallium, and mercury. In some aspects, the closed channel is evacuated to a vacuum. In some aspects, each surface of the insulating lateral sides, upper and lower sides, and passive thermal actuator contacting the liquid slug are coated with Teflon.

Other objects and features will be in part apparent and in part pointed out hereinafter. Additional details of the disclosed materials and methods in various aspects are provided below.

DESCRIPTION OF THE DRAWINGS

The patent or application file contains at least one drawing executed in color. Copies of this patent or patent application publication with color drawing(s) will be provided by the Office upon request and payment of the necessary fee.

The following drawings illustrate various aspects of the disclosure.

Those of skill in the art will understand that the drawings, described below, are for illustrative purposes only. The drawings are not intended to limit the scope of the present teachings in any way.

DETAILED DESCRIPTION

The present disclosure is based, at least in part, on the discovery that a passive thermally activated switch including, but not limited to, a bimetallic strip, could be used to reversibly move a liquid slug from an insulating region of a channel to a thermally conductive portion of the channel, thereby changing the state of the switch from a thermally isolating condition to a thermally conductive condition.

In various aspects, a passive thermally activated switch is disclosed in which a thermally conductive liquid slug positioned between a bimetallic strip and at least one internal surface of a channel is displaced into or out of a thermally conductive portion of the channel due to deformations of the bimetallic strip resulting from heating or cooling of the bimetallic strip. As described in additional detail below, the deformations of the liquid slug beneath the bimetallic strip induce a Laplace pressure gradient in the liquid slug that causes the movements of the liquid slug. The disclosed passive thermal switch overcomes at least several challenges of existing technologies. The heat sink and source of the disclosed passive thermal switch are fixed in space and do not move in order to make contact, thereby increasing the structural integrity of the switch and decreasing the complexity of the switch and supporting structure. Further, the liquid metal slug adapts to any roughness or arbitrary shape, thereby decreasing the thermal contact resistance by up to an order of magnitude as compared to solid-solid thermal interfaces. The features of the disclosed passive thermal switch provide for ready integration with flexible thermal management systems.

Passive Thermal Switch Device

Figure 4A:
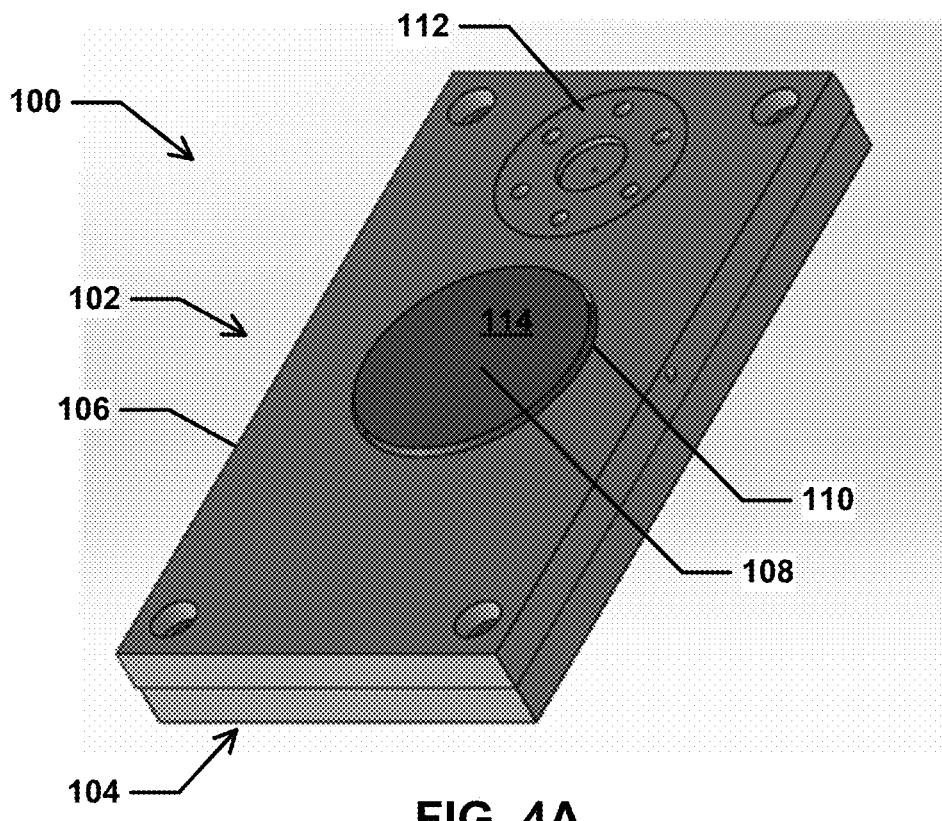
FIG. 4A is a top schematic diagram of an assembled thermal switch.
Figure 4B:
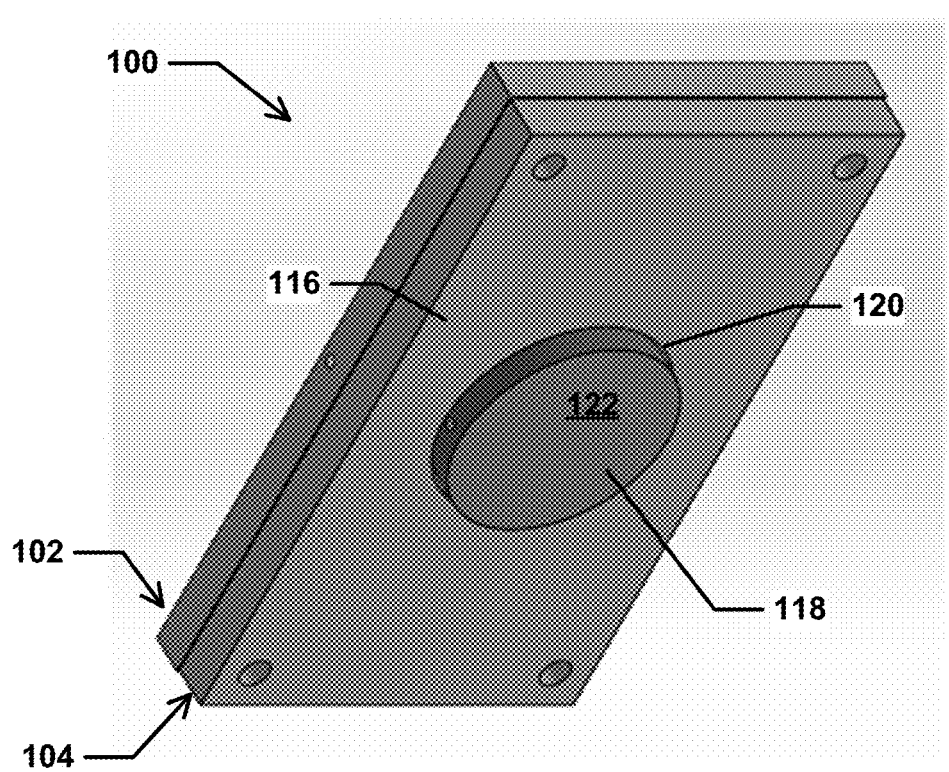
FIG. 4B is a bottom schematic diagram of the assembled thermal switch of FIG. 4A.
Figure 5:
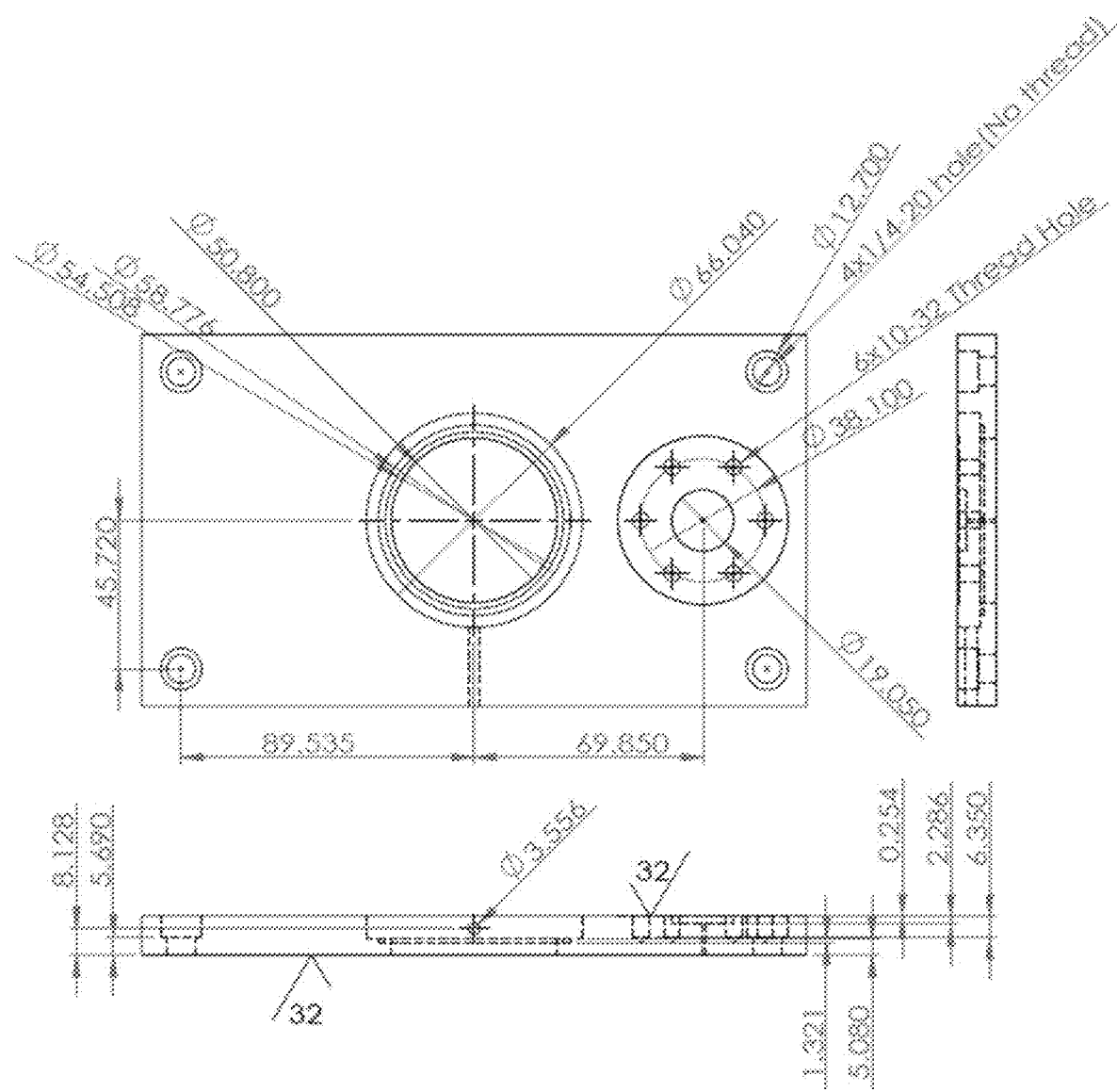
FIG. 5 contains detailed drawings of the top portion of the thermal switch shown in FIG. 4A, including top, end, and side views.
Figure 6:
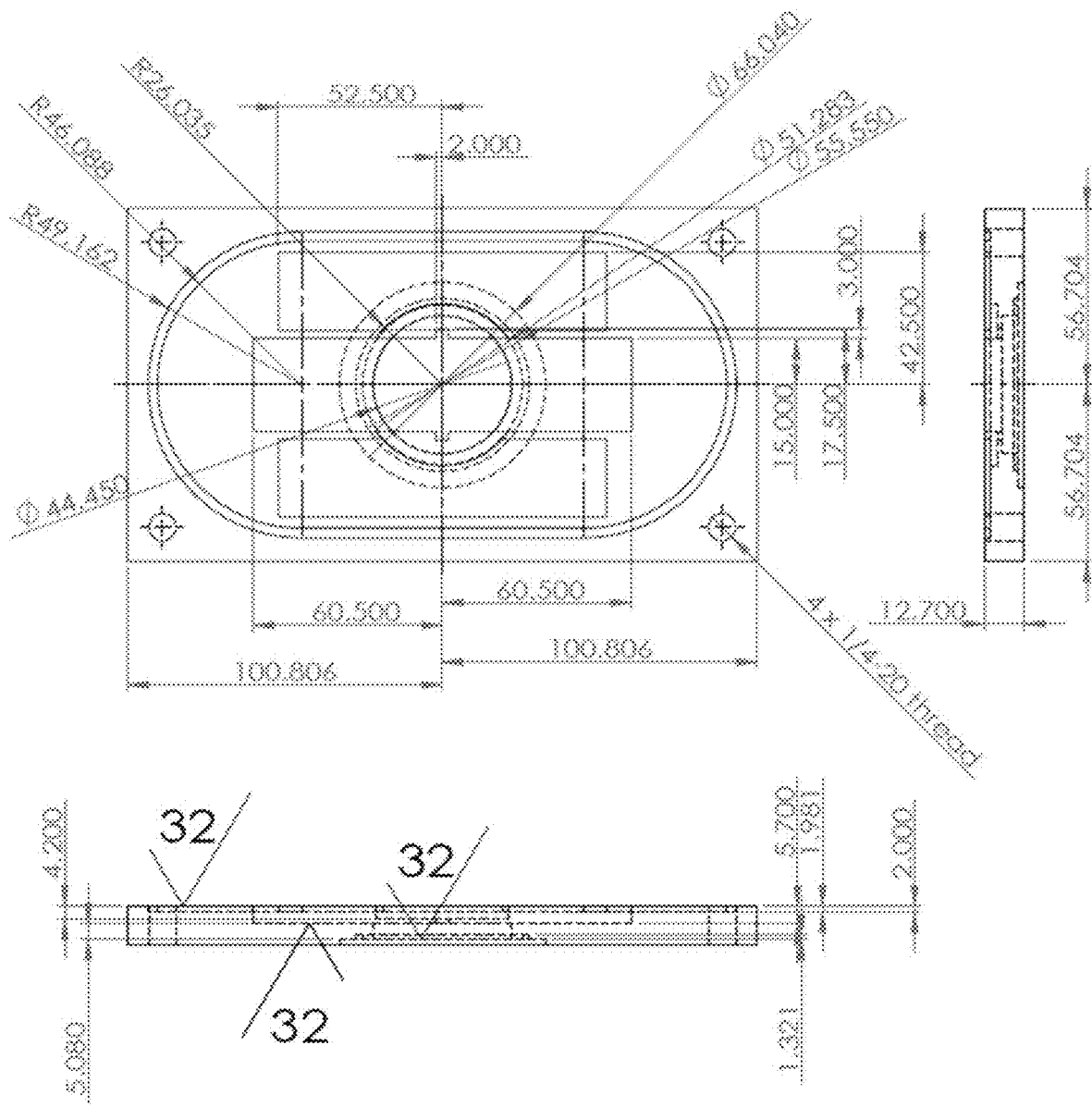
FIG. 6 contains detailed drawings of the bottom portion of the thermal switch shown in FIG. 4B, including bottom, end, and side views.

FIGS. 4A and 4B are top and bottom schematic views of the passive thermal switch device in one aspect. The device 100 includes an upper portion 102 and a lower portion 104. As illustrated in FIG. 4A, the upper portion 102 includes an upper body 106 and an upper thermal conductor 108. An upper conductor opening 110 and a vacuum fitting 112 are formed within the upper body 106. The upper thermal conductor opening 110 is configured to receive the upper thermal conductor 108 such that an outer surface 114 of the upper thermal conductor is exposed to the exterior environment and an inner surface (not shown) of the upper thermal conductor 108 is in contact with the passive actuation module (not shown). The vacuum fitting 112 is configured to operatively connect to an external vacuum device (not shown) and includes a vacuum conduit (not shown) connecting the vacuum fitting 112 with the internal channel of the passive actuator module (not shown). In one optional aspect, a vacuum fitting 112 is provided with a 1-mm diameter through-hole and six 10-32 thread holes for vacuum sealing using a KF-16 O-ring and clamp on the surface of the upper body 106. By way of non-limiting example, FIG. 6 is a detailed drawing of the upper portion of a thermal switch device in one aspect.

Figure 7:
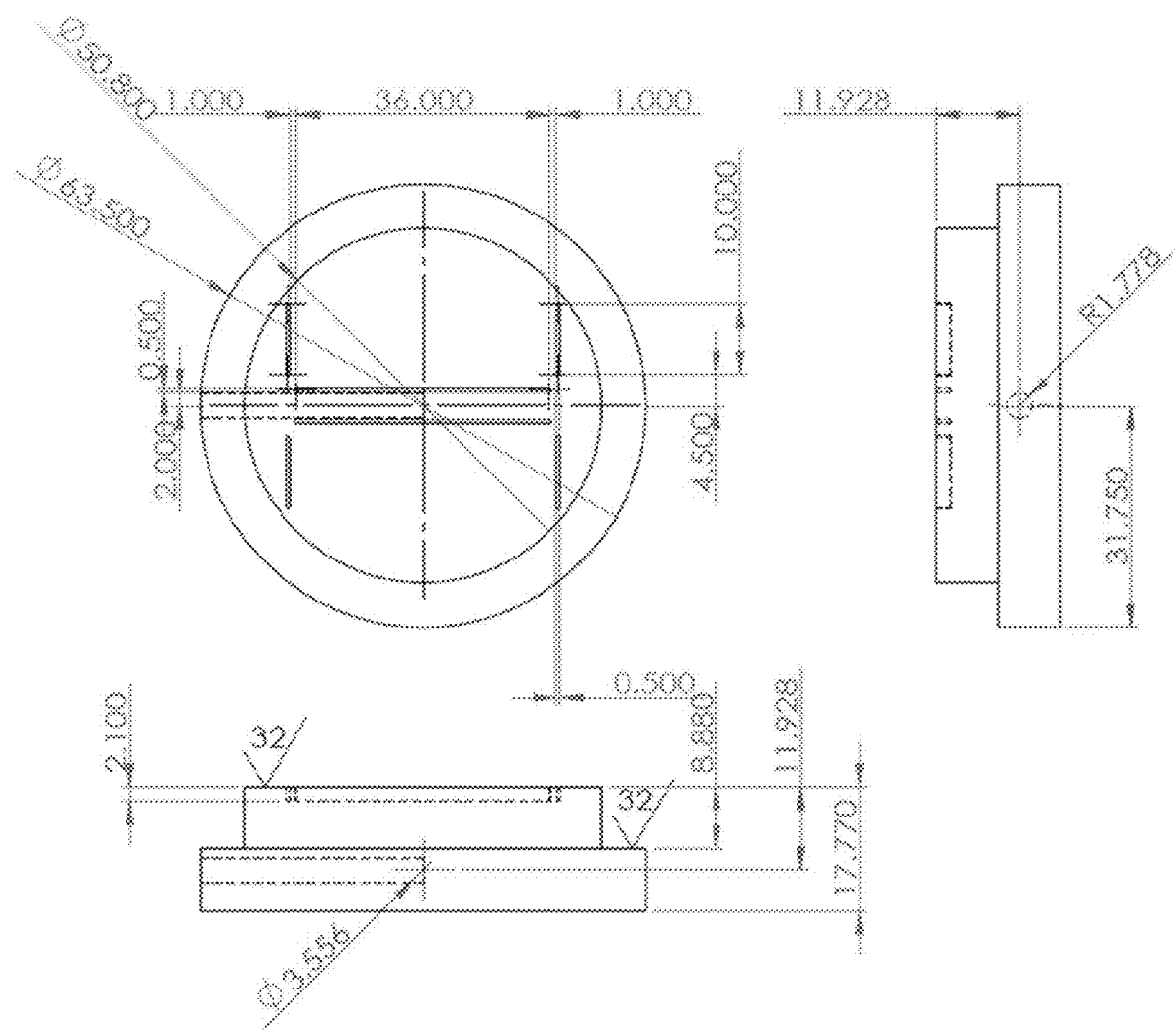
FIG. 7 contains detailed drawings of the top conductor of the thermal switch shown in FIG. 4A, including top, end, and side views.

As illustrated in FIG. 4B, the lower portion 104 includes a lower body 106 and a lower thermal conductor 118. A lower conductor opening 120 is formed within the lower body 106 that is configured to receive the upper thermal conductor 108 such that an outer surface 122 of the lower thermal conductor 118 is exposed to the exterior environment and an inner surface (not shown) of the lower thermal conductor 118 is in contact with the passive actuation module (not shown). By way of non-limiting example, FIG. 7 is a detailed drawing of the lower portion of a thermal switch device.

Figure 21A:
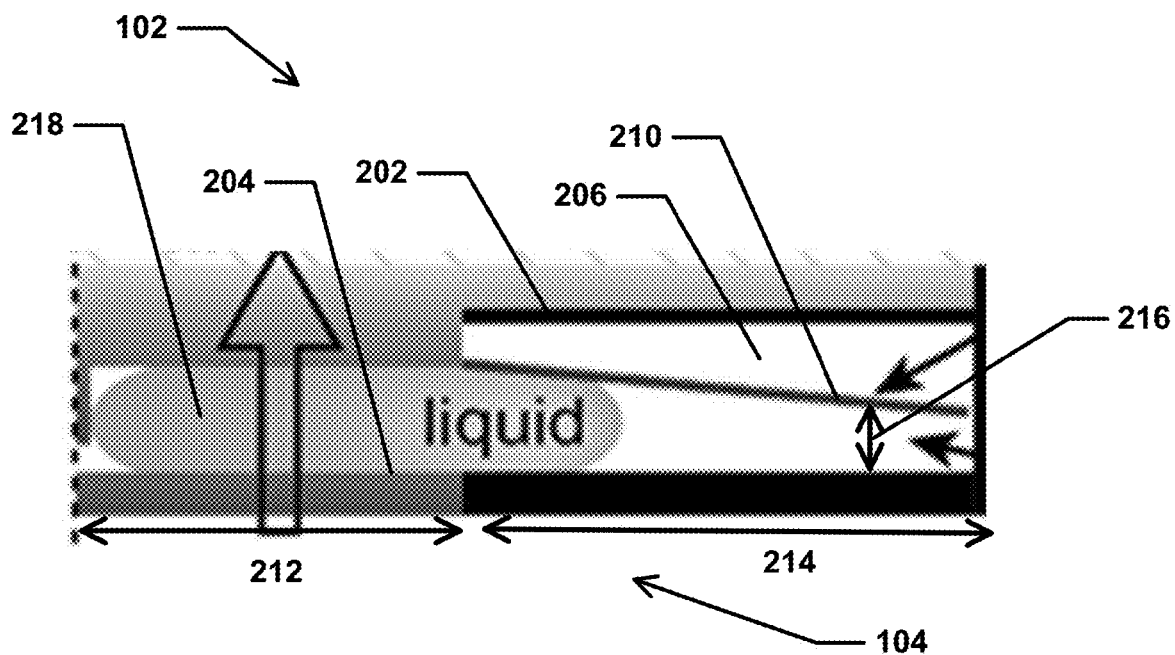
FIG. 21A is a schematic diagram of a passive thermal switch configured in a thermally conductive ("ON") state.
Figure 21B:
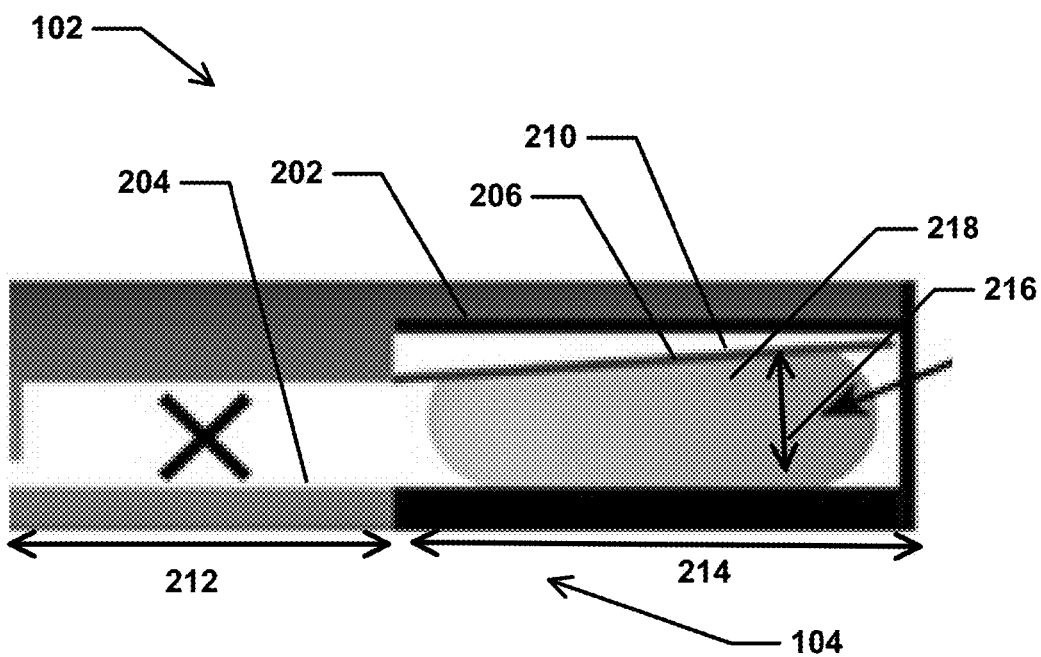
FIG. 21B is a schematic diagram of a passive thermal switch configured in a thermally non-conductive ("OFF") state.

In one aspect, illustrated in FIGS. 21A and 21B, the upper portion 102 includes an upper wall 202 and a portion of the lateral walls, and the lower portion 104 includes a lower wall 204 and portion of the lateral walls that together define a closed channel 206 containing the liquid slug 208 and the passive thermal actuator 210. The closed channel 206 includes a heat conducting region 212 that includes a first portion of the upper and lower sides made of a heat conducting material and an insulating region 214 that includes a second portion of the upper and lower sides each made of an insulating material. In one aspect, the passive thermal actuator 210 is a bimetallic strip with one end thermally coupled to the heat conducting material within the upper side 202 of the heat conducting region 212 with the free end of the bimetallic strip positioned within the insulating region 214. The bimetallic strip may be heated or cooled by heat transfer through the heat conducting material within the upper side 202 of the heat conducting region 212, causing deformation of the bimetallic strip in an upward (FIG. 21A) or downward (FIG. 21B) direction relative to the lower wall 204. As described in additional detail below, this deformation changes the separation distance 216 of the free end of the bimetallic strip 210 relative to the lower wall 204.

Figure 10:
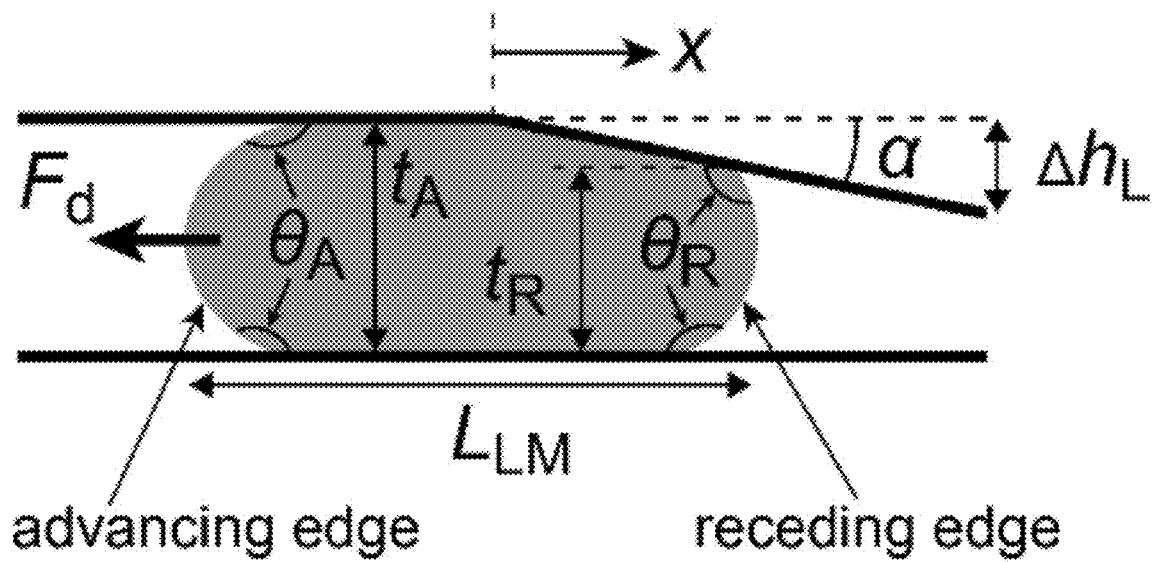
FIG. 10 is a schematic illustration of passive self-transport of a liquid metal drop, shown advancing to an ON (thermally conductive) configuration.

As described in additional detail below, the deformation of the bimetallic strip 210 causes movement of a liquid slug 218 along the closed channel 206 by inducing a Laplace pressure gradient on the liquid slug 218 (see FIG. 10). The movement of the liquid slug 218 ranges between the insulating region 214 (see FIG. 21B) and the thermally conductive region 212 (see FIG. 21A) of the closed channel 206 over the switching temperature range.

In various aspects, the bimetallic strip 210 may be thermally coupled to the thermally conductive material of the upper wall 202 (FIG. 21A) or to the thermally conductive material of the lower wall 202. In various other aspects, the bimetallic strip 210 may be provided in any undeformed profile, as described below, including, but not limited to, an undeformed profile in which the free end is near the upper wall 202 (FIG. 21A) or an undeformed profile in which the free end is near the lower wall 204. In various additional aspects, the bimetallic strip may be oriented within the closed channel such that the free end deflects upward or deflects downward when the actuator temperature of the bimetallic strip passes through a switching temperature range defined by a minimum switching temperature and a maximum switching temperature.

In various aspects, the passive thermal switch is configured in a thermally conductive ("ON") state when the liquid slug 218 is positioned within the thermally conductive portion 212 of the closed channel 206, as illustrated in FIG. 21A. In various other aspects, the passive thermal switch is configured in a thermally non-conductive ("OFF") state when the liquid slug 218 is positioned within the insulative portion 214 of the closed channel 206, as illustrated in FIG. 21B.

Figure 8:
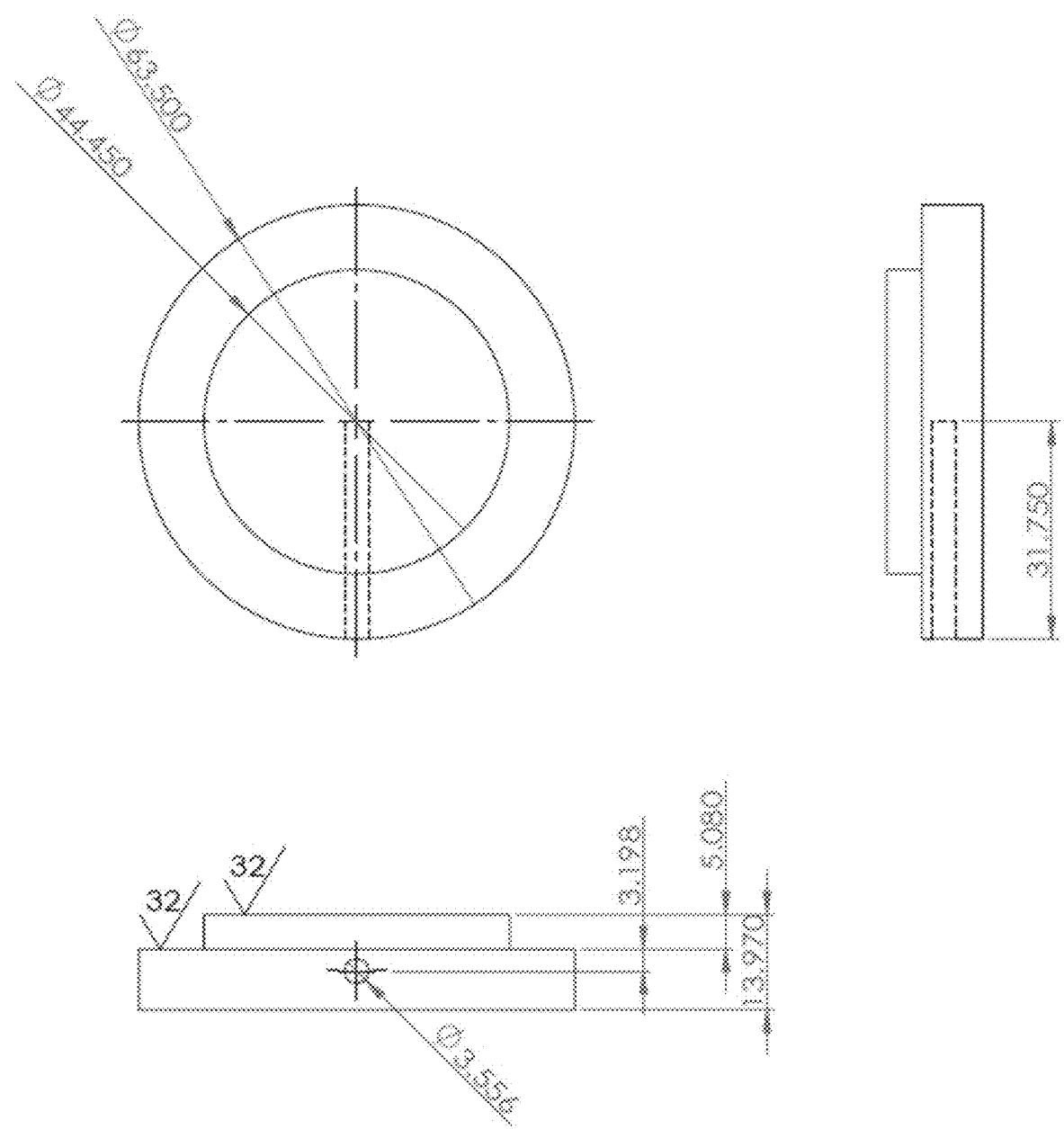
FIG. 8 contains detailed drawings of the bottom conductor of the thermal switch shown in FIG. 4B, including bottom, end, and side views.

In various aspects, the upper and lower thermal conductors may be formed using any suitable thermally conductive materials without limitation. In some aspects, the upper and lower thermal conductors are formed from a metal, a thermally conductive ceramic, graphite, and any combination thereof. Non-limiting examples of suitable thermally conductive metals include copper, aluminum, silver, gold, iron, magnesium, zinc, tungsten, molybdenum, steel, and any combination or alloy thereof. Non-limiting examples of suitable thermally conductive ceramics include Shapal, Boron Nitride, and any combination thereof. By way of non-limiting example, FIG. 8 is a detailed drawing of a conductor in one aspect.

In various aspects, the upper and lower bodies may be formed using any suitable thermally insulating materials without limitation. In some aspects, the upper and lower bodies are formed using an insulating polymer, an insulating ceramic, or any other suitable insulating material without limitation. Non-limiting examples of suitable insulating materials include polyetheretherketone (PEEK), an acrylic, an alumina ceramic, a zirconia ceramic, and any combination thereof.

Liquid Slug

In various aspects, the liquid slug is an amount of a thermally conductive liquid. Depending on the volume of the liquid slug, the liquid slug may occupy only a portion of the width of the channel or the entire width of the channel. In various aspects, if the liquid slug fills the entire width of the channel, the channel width (W) of the passive heat switch device is determined at least in part by the size or volume of the liquid metal drop. In various other aspects, the liquid metal drop similarly occupies the space between the bimetallic strip and the bottom surface of the channel (i.e. "channel height") in order to experience the Laplace pressure gradient described below. Consequently, the channel height is similarly determined at least in part by the size or volume of the liquid metal drop.

In various aspects, the shape of a liquid metal drop sitting on a substrate is influenced by at least one or more of a plurality of factors including, but not limited to, composition of the liquid metal droplet, the composition of the materials forming the channel that contact the liquid metal droplet, the size of the liquid metal droplet, and any other relevant factor without limitation.

Figure 9:
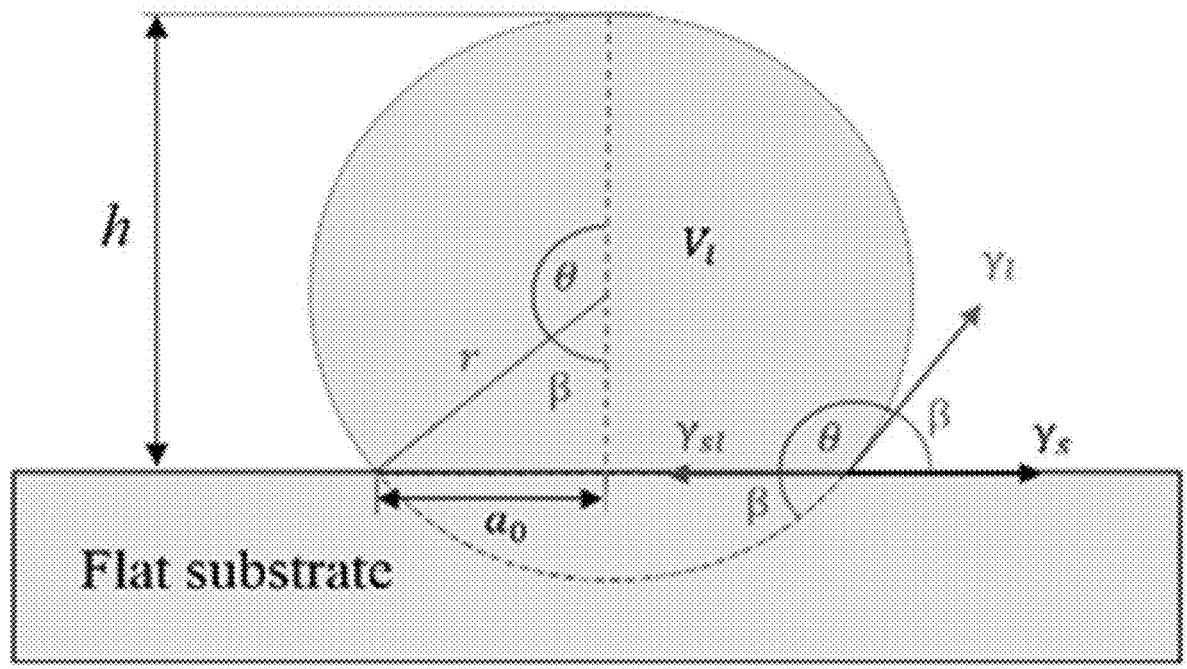
FIG. 9 is a schematic illustration of a liquid metal drop sitting on a solid substrate.

FIG. 9 is a schematic illustration showing a liquid metal drop on a substrate. When a liquid metal drop sits on a solid substrate, its height (h) and contact radius with the substrate ($a_0$) are determined by its size (i.e., drop radius R) and contact angle ($\theta$). The size of a liquid drop is typically scaled by its capillary length $$\kappa^{-1} = \sqrt{\frac{\gamma}{\rho g}}$$

(where $\gamma$, $\rho$, g, are surface tension, density, and gravitational acceleration, respectively) The shape of a liquid metal drop sitting on a solid surface is determined by its volume ($V_l$) and its contact angle ($\theta$) against the surface. When the volume of the liquid metal drop is more than the capillary volume ($V_{capillary}$), the gravitational forces dominate the capillary forces acting on the liquid metal drop, and the liquid metal drop deforms from a spherical shape to a puddle.

As used herein, capillary volume is defined as $$V_{capillary} = \frac{4}{3}\pi \left(\sqrt{\frac{\gamma}{\rho g}}\right)^3,$$

when the drop radius r reaches the capillary length $$\kappa^{-1} = \sqrt{\frac{\gamma}{\rho g}}$$

(where $\gamma$, $\rho$, g, are surface tension, density, and gravitational acceleration, respectively).

For very small liquid drops with $R \ll \kappa^{-1}$, gravity effect on distorting the spherical shape of the liquid is negligible, therefore the liquid height is determined by Eq. (1):

$$h = a_o \tan\frac{\theta}{2} \qquad \text{Eq. (1)}$$

Eq. (2) shows the correlation between the volume of drop ($V_l$), contact angle, contact radius and radius of the drop:

$$V_l = \frac{\pi r^3}{3}(2 - 3\cos\theta + \cos^3\theta) = \frac{\pi h^3}{3}\left(\frac{2+\cos\theta}{1-\cos\theta}\right) = \frac{\pi h}{6}(3a_o^2 + h^2) \qquad \text{Eq. (2)}$$

The interaction of a liquid metal drop with the solid surface is similar to the interaction of a liquid drop with a non-wettable surface. For the case of a small drop ($R \ll \kappa^{-1}$) sitting on a non-wettable surface, the capillary forces strive to keep the spherical shape of the drop whereas the gravitational forces tend to increase the solid-liquid contact radius. The contact radius ($a_0$) is related to the radius of the drop (R) and the displacement of the center of mass of the drop ($\delta$) due to its weight as:

$$a_0 \approx \sqrt{R\delta} \qquad \text{Eq. (3)}$$

The drop is almost spherical except at the bottom where it contacts with the substrate (see FIG. 9). The increase in the surface area of the drop due to flattening from the bottom is on the order of $\Delta s \approx a_0^4/R^2$. Therefore, the energy balance between the increase in the surface energy $\gamma \Delta s \approx \gamma\, a_0^4/R^2$ and the decrease in the gravitational potential energy of the drop $\rho R^3\, g\delta$ results in an expression for $\delta$ as given by:

$$\delta \approx \rho g R^3/\gamma \qquad \text{Eq. (4)}$$

Substituting Equation (4) into Equation (3) results in:

$$a_0 \approx R^2/\kappa^{-1} \qquad \text{Eq. (5)}$$

For miniaturizing the actuation as described below, the characteristics of the liquid metal droplet as disclosed in Eqs. (1)-(5) may be considered simultaneously. For the liquid slug to experience Laplace pressure gradients within the channel of the disclosed passive thermally activated switch, the channel width W is subject to the condition $W<a_0$, and the channel height at the thermally conductive state position $h_0$ is subject to the condition $h_0<h$, both of which are characterized by the capillary length $$\kappa^{-1} = \sqrt{\frac{\gamma}{\rho g}}.$$

In various aspects, the shape of the liquid metal drop may influence the design of the passive thermally activated switch. The shape of the liquid metal drop is influenced by the size of the drop, and may assume a shape including, but not limited to, a spherical drop as illustrated in FIG. 9 or a puddle as described below.

In the case where $R>\kappa^{-1}$ in the liquid metal drop, gravity dominates the capillary forces and flattens the drop to a puddle. Since the height of the puddle (H) scales with the capillary length ($\kappa^{-1}$), conservation of mass ($a_0^2 H \sim R^3$) leads to the contact radius scaling as:

$$a_0 \approx R^{3/2}/\kappa^{-1/2} \qquad \text{Eq. (6)}$$

The numerical coefficients of Equations (5) and (6) both describe the same contact radius but within different ranges of drop volume. To derive a unified expression for contact radius $a_0$, a common numerical coefficient may be developed by considering conservation of mass and the height of a puddle as expressed by Eq. (7):

$$H = \sqrt{2(1-\cos\theta)}\,\kappa^{-1} \qquad \text{Eq. (7)}$$

The resulting common numerical coefficient, $$C_0 = \left(\frac{4}{3\sqrt{2(1-\cos\theta)}}\right)^{1/2},$$

may be used to derive expressions for the contact radius for various sizes of liquid drops:

$$\begin{cases} a_0 = C_0 R^2 \kappa & \text{for } R < \kappa^{-1} \\ a_0 = C_0 R^{\frac{3}{2}} \kappa^{\frac{1}{2}} & \text{for } R > \kappa^{-1} \end{cases} \qquad \text{Eq. (8)}$$

In one aspect, the liquid metallic drop is Galinstan. Galinstan is an alloy of gallium, indium, and tin. Galinstan has a melting point at about $-19°$ C. and assumes a liquid metal state at room temperature. Galinstan has a relatively high liquid thermal conductivity ($k \approx 16.5$ W/mK) and a very low vapor pressure of less than about $10^{-8}$ Torr, providing Galinstan with good vacuum compatibility. Other physical properties of Galinstan include: $\gamma=589$ (mN/m) and $\rho=6400$ (kg/m$^3$). When in contact with a Teflon-coated copper substrate, Galinstan has a static contact angle of $\theta=150°$, an advancing contact angle of $\theta_A \approx 153°$, and a receding contact angle of $\theta_R \approx 143°$. Using these physical properties in the equations described above, $\kappa^{-1}=3.1$ mm and H=5.9 mm.

Other properties of Galinstan include a very strong oxidation potential and vulnerability to embrittlement due to strong corrosion with other metals. Because of the reactive chemical properties of Galinstan, a layer or coating may be applied to those surfaces of the passive thermal switch device that may contact and react with the Galinstan droplet. In various additional aspects, the coating may further provide a uniform contact surface for the liquid slug to facilitate movement along the channel of the passive thermal switching device. Non-limiting examples of suitable coating materials include a Teflon coating as described in the Examples below.

Bimetallic Strip Passive Thermal Actuator

In various aspects, the passive thermal actuator fits within the closed channel such that the liquid metal within the channel is prevented from moving between the outer edges of the bimetallic strip and the lateral walls of the channel. Consequently, the width of the channel and the bimetallic strip are essentially constant and almost the same in the entire channel.

In some aspects, the margin between the bimetallic strip and the lateral channel walls may be limited to <0.5 mm, to minimize leaks of the liquid slug to the other side of the bimetallic strip. By way of non-limiting example, since the capillary length of Galinstan on a Teflon-coated substrate is $\kappa^{-1}=3.1$ mm, the minimum width of the bimetallic strip may be $0.16 \times \kappa^{-1}$ (i.e., $W>0.16 \times \kappa^{-1}$). This condition and the additional conditions described above ($W<a_0$ and $h_0<h$) define the limiting dimensions of the passive actuation module in some aspects.

In some aspects, the condition $h_0<h$ described above assures that a Laplace pressure gradient is generated inside the liquid drop when it is pushed down by the bimetallic strip to the bottom of the channel. However, if the liquid drop is pushed down too much, the liquid drop may stick to the channel and the movement from thermally conductive state to the thermally non-conductive state may be disrupted. Without being limited to any particular theory, this sticking phenomenon depends at least in part on the compositions and associated contact properties of the liquid drop and the materials of the channel walls. As described in the examples below, a Galinstan drop with a $\kappa^{-1}=3.1$ mm in a Teflon-coated channel with $h_0=1.5$ mm ($\sim 0.49 \times K^{-1}$) experienced disruption of switching due to the Galinstan drop sticking to the Teflon-coated channel sides. In some aspects, the condition $0.49 \times K^{-1} < h_0 < h$ may be used to define a channel height with reduced risk of liquid drop sticking during the operation of the passive thermal switch device.

Passive Actuation Module

Figure 1:
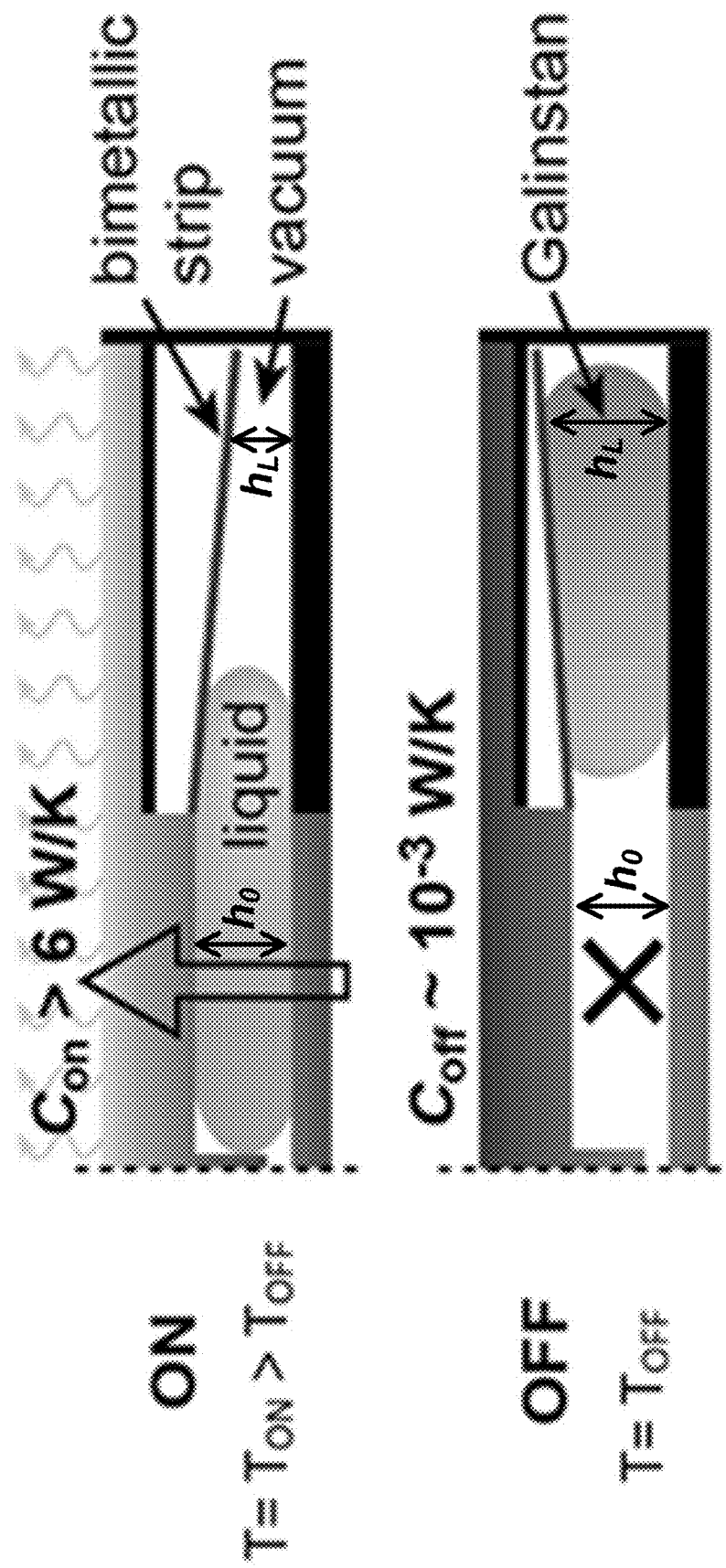
FIG. 1 is a schematic illustration showing the working principle of the actuation module and the thermal heat switch.

In various aspects, the passive heat switch device reconfigures between a thermally conductive ON state and a thermally non-conductive OFF state by moving a liquid metal drop from a first position to a second position within a closed channel using a passive actuation module. The passive actuation module moves the liquid metal drop within the channel of the thermal switch by inducing a Laplace pressure gradient along the liquid metal drop. FIG. 1 is a schematic illustration showing the working principles of the passive actuation module in one aspect.

As the temperature of the top conductor changes between a minimum switching temperature and a maximum switching temperature, a bimetallic strip attached to a conductor bends, and consequently, the height of the channel varies, which causes the Laplace pressure gradient (ΔP). At the thermally non-conductive state (i.e., T=minimum switching temperature) the bimetallic strip is bent such that the channel height at the free end of the bimetallic strip ($h_L$) is larger than the channel height between the conductors ($h_0$). The smaller the channel height, the higher the Laplace pressure inside the liquid slug (i.e., $P_0 > P_L$).

In various aspects, the bimetallic strip may be provided in any pre-bended profile without limitation. The term "pre-bended profile", as used herein, refers to the profile along the length of the bimetallic strip prior to additional bending or deformation resulting from changes in temperature of the bimetallic strip. Non-limiting examples of suitable profiles of the bimetallic strip include a straight or planar profile, a curved profile over at least a portion of the strip, discrete bends between straight sections over at least a portion of the strip, and any combination thereof. By way of non-limiting example, the pre-bended profile of the bimetallic strip is provided as the profile of the bimetallic strip at the minimum switching temperature. In some aspects, the pre-bending profile of the bimetallic strip is subject to the condition $h_L < H$, where $h_L$ is the channel height at the end of the channel x=L and H is the maximum height of the liquid slug as given by Eq. (7). Without being limited to any particular theory, the difference between the height of the liquid slug at leading and trailing edges generates the Laplace pressure gradient (see FIG. 10). The liquid metal moves whenever the driving force ($F_d$) caused by the Laplace pressure gradient overcomes the resistance force ($F_r$), subject to the above conditions.

In one aspect, illustrated in FIGS. 21A and 21B, the increase in channel height at the free end of the bimetallic strip caused by strip bending induces a Laplace pressure gradient favorable for movement of the liquid metal drop from the thermally conductive region towards the free end of the bimetallic strip (i.e., movement from thermally conductive region to the insulative region of the channel). At the thermally conductive state, however, the bimetallic bends towards the bottom part of the channel due to the increase in temperature from the minimum switching temperature to the maximum switching temperature, and consequently $h_L < h_0$ which is translated to $P_L > P_0$, a Laplace pressure gradient favorable for movement of the liquid metal drop from the free end of the bimetallic strip towards the thermally conductive region of the channel.

In various aspects, the length of the bimetallic strip is selected to provide the desired degree of deflection due to thermal deformation. The deflection of the bimetallic strip at the free end is described by Eq. 9:

$$v_{(x)} = \frac{\alpha \Delta T}{m^2 s}(e^{-mx} + mx - 1) \quad \text{Eq. (9)}$$

where α and s are specific deflection and thickness of the bimetallic strip, respectively, and m is defined as $$m = \sqrt{\frac{2h(s+W)}{KsW}},$$

in which h and K are convection coefficients in the channel and thermal conductivity of the bimetallic strip, respectively.

The experimental data showed that heating movement starts when $h_L \sim 0.5 \times h_0$. The heating movement is concluded when the bimetallic touches the bottom, i.e., $h_L=0$. Moreover, to assure that heat bending can overcome the liquid metal opposition load force, some extra heat bending force load is needed. Therefore, the length of the bimetallic in the switch that pushes the liquid metal from the thermally conductive state to the thermally non-conductive state for a temperature change of ΔT is subject to the condition expressed in Eq. (10):

$$h_L < v_{(x=L)} = \frac{\alpha \Delta T}{m^2 s}(e^{-mL} + mL - 1) \quad \text{Eq. (10)}$$

where $h_L$ is the channel height at the free end of the bimetallic at thermally non-conductive state (pre-bended profile), subject to the condition $h_L < H$ as described above.

As described in the examples below, experimental data shows that the heating movement of the liquid metal drop starts when $h_L \sim 0.5 \times h_0$ (see FIG. 1). The heating movement of the liquid metal drop concludes when the bimetallic touches the bottom of the channel, i.e., $h_L=0$. Moreover, to assure that the heat bending of the bimetallic strip can overcome the opposition load force of the liquid metal drop, excess heat bending force load is needed from the bimetallic strip. To ensure the availability of excess heat bending force load, the deflection of the bimetallic strip within the switching temperature range ΔT at x=L is configured to be higher than $h_L$. In this configuration, the free end of the bimetallic reaches the bottom of the channel ($v_L = h_L$) at a ΔT that is slightly less than the full range from the minimum to maximum switching temperatures, so that at a little smaller ΔT and thereafter the physics of the module dictates that the bending of the bimetallic stops at that position.

In various aspects, the length of the bimetallic strip is subject to the condition:

$$h_x < v_x = \frac{\alpha \Delta T}{m^2 s}(e^{-mx} + mx - 1) \quad \text{Eq. (11)}$$

By way of non-limiting example, for a Galinstan drop on a Teflon-coated substrate with γ=589 (mN/m), ρ=6400 (kg/m³), and θ=150°, $\kappa^{-1}$=3.1 mm, $V_{capillary}$=120 μL, and H=5.9 mm. To attain Laplace pressure inside this Galinstan puddle, channel height must always be smaller than H Moreover, a channel height as small as ~0.16×$k^{-1}$ (~0.5 mm) induces a higher Laplace pressure than the Galinstan drop can physically withstand. Consequently, in general, the channel height of the passive heat switch device ranges from about 0.16× $k^{-1}$ to about H (see Eq. 7). In various aspects, this dimension limitation applies to the width of the channel as well (i.e., W>0.16×$k^{-1}$).

In various aspects, the liquid metal drop moves within the channel of the passive heat switch device when the driving force of the Laplace pressure gradient created by the deflection of the bimetallic strip exceeds the resistance force ($F_r$) caused by the contact angle hysteresis. Without being limited to any particular theory, contact angle hysteresis refers to the difference in the contact angle of a drop on a supporting surface when advancing or receding. By way of non-limiting example, Galinstan in contact with a Teflon-coated surface has an advancing contact angle $\theta_A \approx 153°$ and a receding contact angle $\theta_R \approx 143°$. In some aspects, the transition from the thermally non-conductive to the thermally conductive state is the most challenging state transition because the liquid metal drop typically experiences a constant channel height of $h_0$ in the thermally non-conductive configuration.

The condition for the thermally conductive state to thermally non-conductive state movement at which the liquid metal droplet moves within the channel of the passive heat switch device (Laplace driving force ($F_d$)>resistance capillary force ($F_r$)) is described in Eq. (12):

$$F_d \approx \gamma l W \left| \frac{1}{h_{receding}} - \frac{1}{h_{leading}} \right| > \qquad \text{Eq. (12)}$$

$$W\gamma|\cos(\theta_R) - \cos(\theta_A)| \approx F_r$$

where l is the length of the liquid drop (i.e., $x_{leading} - x_{receding}$) and $\theta_A$, $\theta_R$ are advancing and receding contact angles, respectively. The only parameter in Eq. (12) that changes while the liquid drop moves along the channel is l because of the various channel heights along the channel. As the liquid drop moves from the thermally non-conductive state to the thermally conductive state, the channel height increases from $h_0$ to $h_L$, which means l decreases as the drop moves. This fact is less concerning during the thermally conductive state to thermally non-conductive state movement because in such movement $h_L<h_0$ and the channel height increases from $h_L$ to $h_0$.

Figure 2A:
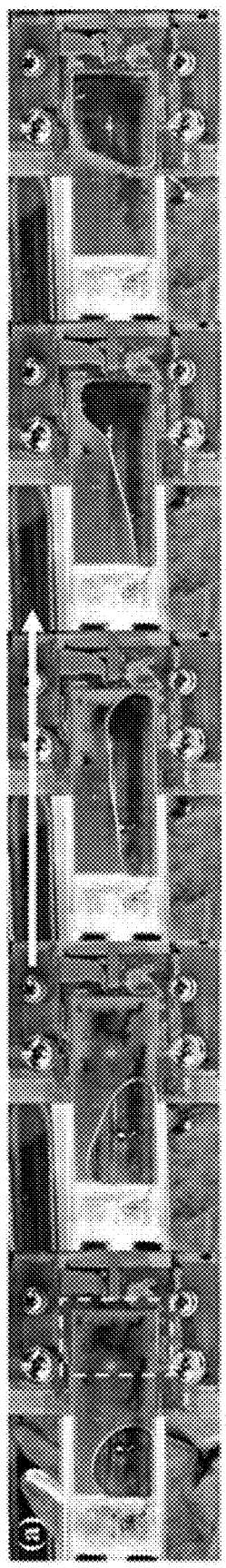
FIG. 2A is a series of images showing a top view of the OFF (thermally non-conductive)-to-ON (thermally conductive) movement (i.e., heating from $T_{OFF}$ to $T_{ON}$; left to right) of 1.6 mL of Galinstan in the channel of the passive actuation module whose first 20 mm portion has a constant height representing the space between the conductors $h_o$ (illustrated by the yellow dashed rectangle).
Figure 2B:
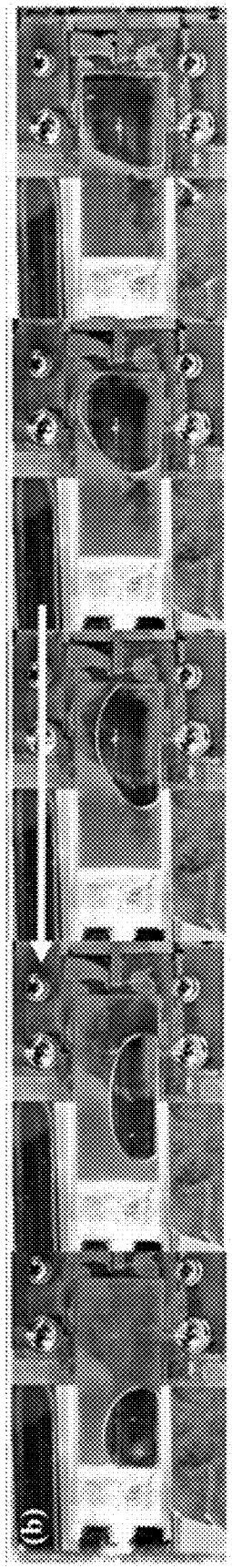
FIG. 2B is a series of images showing a top view of the thermally conductive state-to-thermally non-conductive state movement of Galinstan in the channel of the passive actuation module of FIG. 2A for cooling from $T_{ON}$ to $T_{OFF}$ (right to left).

By way of non-limiting example, FIGS. 2A and 2B contain a series of images showing the thermally non-conductive state-to-thermally conductive state and thermally conductive state-to-thermally non-conductive state movements, respectively of the liquid metal drop within a passive actuation module designed according to the above criteria to work for $\Delta T \approx 37°$ C. The configuration and the dimensions of this actuation module are W=30 mm, L=45 mm, $h_0$=2.0 mm, 3.1 mm, and $v_L$=3.6 mm. As explained above, $0.16k^{-1}<h_0<h_L<v_L<H$. According to the calculations described above, the free end of the bimetallic reached the bottom of the channel at $\Delta T \approx 32°$ C. The liquid metal drop was a Galinstan drop with a volume of 1.6 mL, which had l≈14 mm for the thermally non-conductive state-to-thermally conductive state. Such a configuration concludes that $h_{leading}$=1.52 mm can satisfy Eq. (3), which sounds reasonable according to the initial bending profile of the bimetallic strip shown in FIG. 3 and described in additional detail in the examples below.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application, or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing the scope of the present disclosure defined in the appended claims. Furthermore, it should be appreciated that all examples in the present disclosure are provided as non-limiting examples.

EXAMPLES

The following non-limiting examples are provided to further illustrate the present disclosure. It should be appreciated by those of skill in the art that the techniques disclosed in the examples that follow represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

Example 1

Characterization of Galinstan

To validate the operation of the disclosed passive thermal switch, the following experiments were conducted.

Using the pendent drop method, we measured the surface tension of Galinstan ($\gamma=589\pm7$ mN/m) in a glove box pressurized with Argon. Surface tension of Galinstan is the only driving force for generating the capillary motion of the liquid metal in the channel, and a detailed characterization is hence critical. One of the main reasons for applying vacuum to the heat switch is to prevent Galinstan from oxidizing, which influences the surface tension and causes pinning to the surface. Measuring the surface tension of Galinstan in an inert Argon atmosphere is a close resemblance to our actual experimental condition with feasibility of performance. Based on existing published information, the temperature dependence of the surface tension of Galinstan is essentially negligible in the temperature range likely to be experienced by the liquid metal droplet within the passive thermal switch disclosed herein.

At room temperature, the surface tension of Galinstan was $\gamma=589\pm7$ (mN/m), and surface tension was independent of temperature as discussed above.

Example 2

Prototype of Passive Thermal Switch

To develop a design for a passive thermal switch as disclosed herein, the following experiments were conducted.

The switch design was modified from a previous design to include a copper heat conductor embedded in a thermally insulative polymer (PEEK), resulting in the use of less material, simplification in the machining of parts, and orientation-independent operation.

Figure 11:
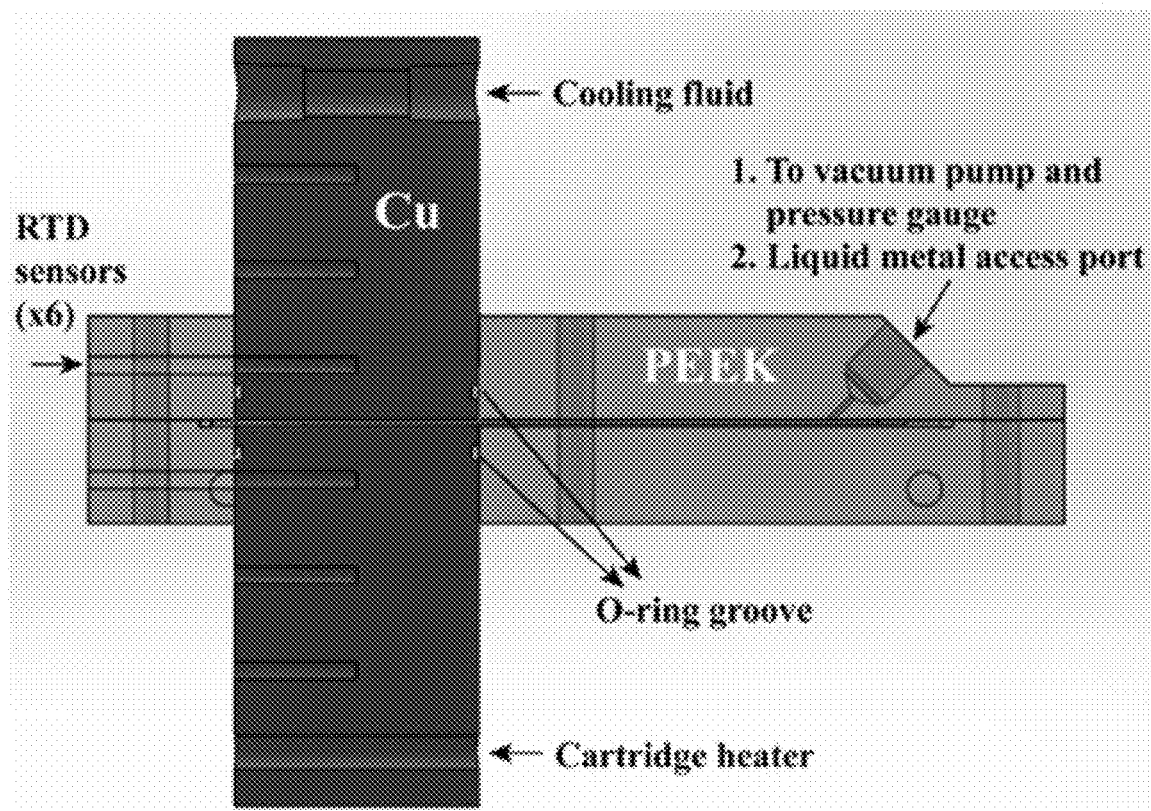
FIG. 11 is a schematic illustration of a passive thermal switch in one aspect.

The resulting prototype passive thermal switch is illustrated schematically in FIG. 11. The prototype switch features a thermally conductive copper rod embedded inside the insulator (PEEK) to make the copper block more machinable, to reduce the amount of PEEK used, and to enable an orientation-independent operation. The channel formed within the PEEK is designed to be continuous (i.e. a single height) to facilitate the motion of the liquid metal within the channel. The vacuum connection and liquid injection ports are designed to be ⅛" NPT and installed at an angle relative to the channel to simplify the system and feasibility of assembling the system in the glove box for the liquid metal injection period of switch fabrication.

The switch design shown in FIG. 11 provides for the evaluation of at least two thermal boundary conditions: 1) constant heat flux using a cartridge heater, and 2) constant temperature using a liquid coolant.

Example 3

Characterization of Contact Properties of Galinstan Drop on Teflon-Coated Copper Substrate To evaluate the contact properties of Galinstan drops on a Teflon-coated substrate, the following experiments were conducted.

To provide a homogeneous contact surface material within the passive thermal switch to provide uniform contact surface properties for the Galinstan drop, a surface coating was provided for the internal switch surfaces. A spray coating stage was assembled to provide for a reproducible coating method for the device. Copper substrates were placed on a motorized stage and the nozzle distance from the stage was adjusted through the frame structure. After spraying the substrates with Teflon AF solution, the substrates were thermally treated to produce smooth Teflon coatings.

Uncoated copper (control) was easily corroded by Galinstan. Coating the copper substrate with a thin Teflon AF layer (up to 6 Teflon layers) prevented direct contact of the substrate surface with Galinstan, but Gallium diffusion was observed through the thin Teflon AF layer, as well as corrosion of the underlying copper substrate after a relatively short period of time. After additional trials with successively thicker Teflon AF coatings, 9 layers of 2% Teflon AF solution applied at about 7.5 cm/s stage speed provided reliable protection against corrosion due to extended contact with the Galinstan drop. No corrosion features were observed on the coated copper substrate beneath the Galinstan droplet after one week of continuous thermal cycling between −15° C. and 130° C. In further testing, the coated copper sheet survived 2.5 months of Galinstan exposure at room temperature.

To assess the contact angles of a Galinstan drop on a Teflon-coated substrate, the following experiments were conducted. Galinstan drops were positioned on Teflon AF-coated copper substrates in an Argon glove box to prevent oxidation, and the substrates were slowly tilted. Advancing and receding contact angles were measured once the droplet started sliding downward.

Figure 12A:
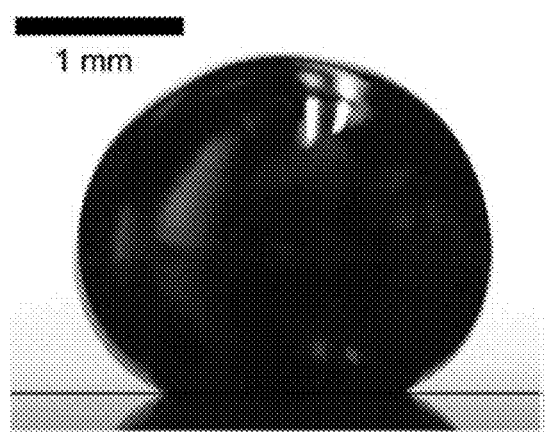
FIG. 12A is an image of a Galinstan drop resting on a Teflon-coated copper substrate.
Figure 12B:
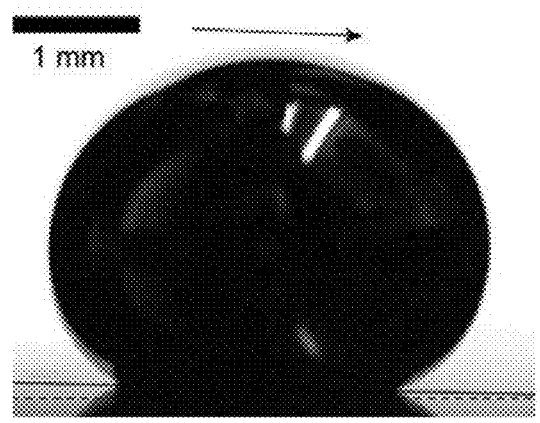
FIG. 12B is an image of the Galinstan drop of FIG. 12A moving on the Teflon-coated copper substrate in the direction indicated by the arrow.

Based on the image of FIG. 12A, the static contact angle was measured as $\theta=150°\pm3°$. Based on the image of FIG. 12B, the advancing/receding contact angles were measured to be $\theta a=153°\pm3°$, $\theta r=144°\pm3$ for the Galinstan drop on the Teflon-coated copper substrate. The advancing/receding contact angles facilitate the characterization of the capillary forces in the channel for the passive actuation mechanism of the passive thermal switch disclosed herein.

Example 4

Deflection of Bimetallic Strip Under Non-Uniform Heating and Cooling

To characterize the thermal and deflection profiles of a bimetallic strip under non-uniform heating and cooling, the following experiments were conducted. The thermal analysis setup was used for measuring the temperature distribution along the bimetallic strip (30×35 mm in W×L) via an IR camera and measuring its deflection via a Canon DSLR camera. The bimetallic strip was painted black for the best IR read-out. A piece of wood was used to hold an RTD sensor on the strip and both were attached firmly to the Peltier thermoelectric element. The deflection was recorded for set temperatures of −10° C. to 60° C. with 10° C. intervals.

Figure 13A:
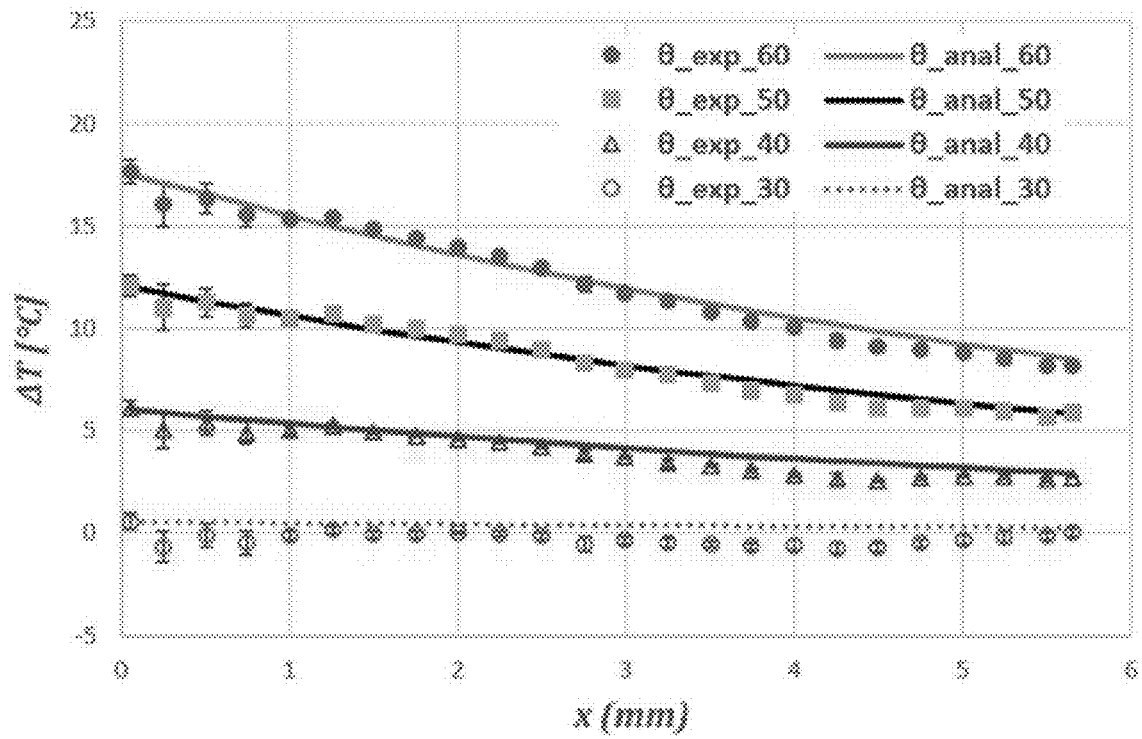
FIG. 13A is a graph summarizing a comparison between experimental temperature distribution measurements ($\theta_{exp}$) and the analytical prediction ($\theta_{anal}$) along a bimetallic strip for various set temperatures during heating.
Figure 13B:
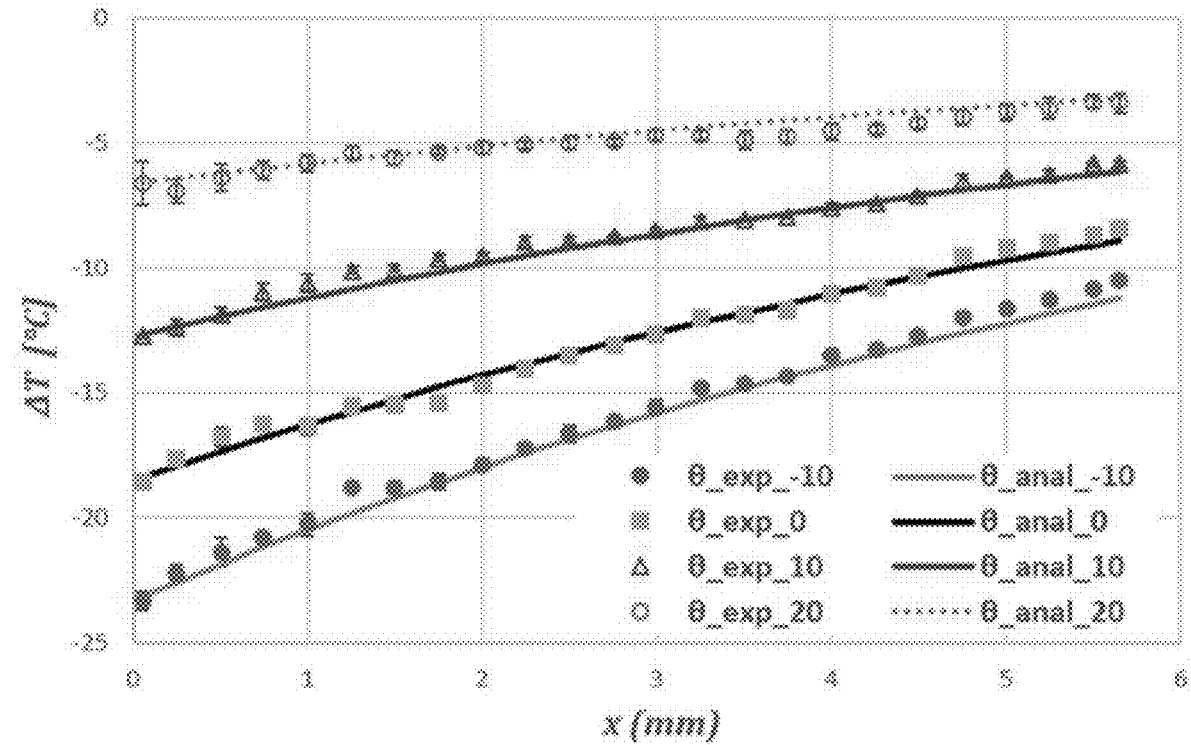
FIG. 13B is a graph summarizing a comparison between experimental temperature distribution measurements ($\theta_{exp}$) and the analytical prediction ($\theta_{exp}$) along a bimetallic strip for various set temperatures during cooling.

A Peltier was used to heat up and cool down the fixed end of the bimetallic strip to a specific temperature, controlled by a homemade PID controller, reaching the set temperature after 60 sec. FIGS. 13A and 13B illustrate that temperature distribution acquired by IR-camera matched well with the classical thermal distribution predicted for extended surfaces according to Eq. (13):

$$\theta_x = \theta_b e^{-mx} \qquad \text{Eq. (13)}$$

where $$m = \sqrt{\frac{hp}{kA_c}},$$

$\theta_b = T_{base} - T_\infty$, h is the convection coefficient of air and k is the thermal conductivity of the bimetallic strip.

To the best of our knowledge, the deflection of a bimetallic cantilever has been studied only for uniform temperature change of the bimetallic strip. In the system of the present experiment, however, the strip underwent a non-uniform temperature change. To find a correlation between the temperature distribution along the cantilever and the corresponding deflection, the following experiments were conducted.

Figure 14A:
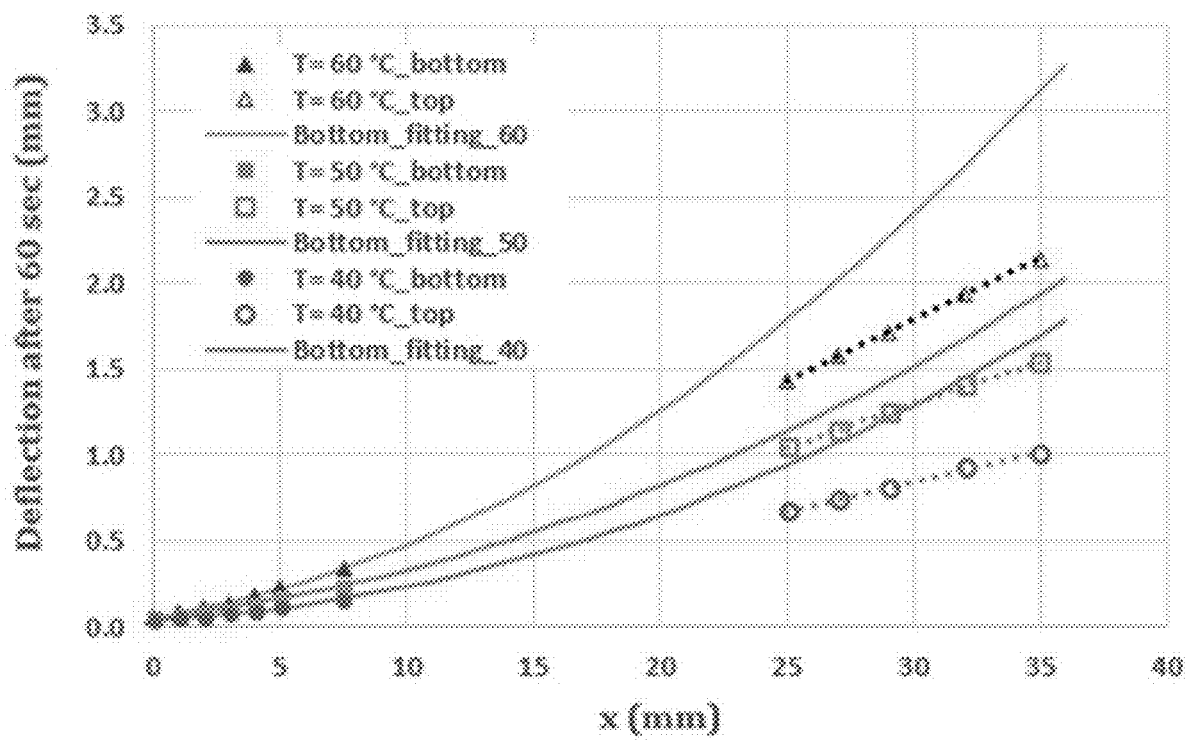
FIG. 14A is a graph summarizing the deflection of a bimetallic strip for the top and bottom portion of the strip for 3 different set point temperatures during heating; lines are curve fits.
Figure 14B:
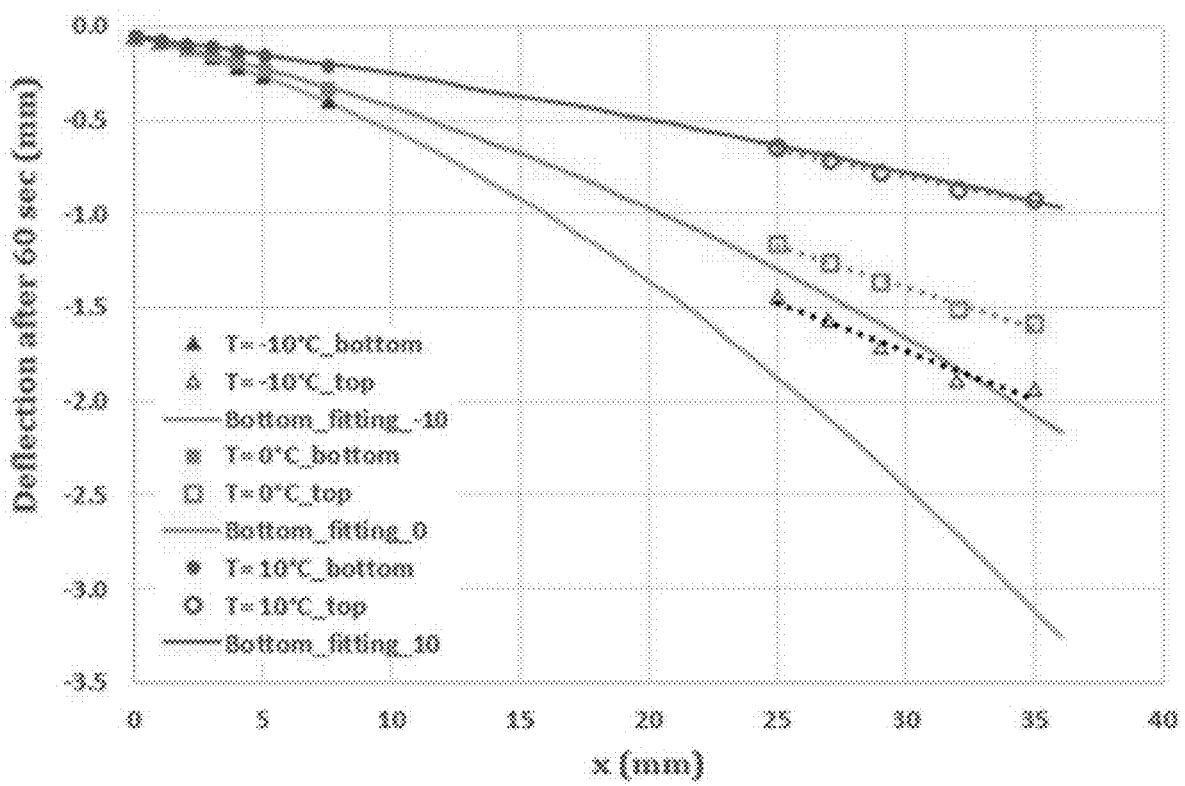
FIG. 14B is a graph summarizing the deflection of a bimetallic strip for the top and bottom portion of the strip for 3 different set point temperatures during cooling; lines are curve fits.

The classic analysis of the deflection of an evenly heated bimetallic strip states that the deflection is correlated to its length quadratically (y~$L^2$). However, we find that such a quadratic deflection does not accurately describe the deflection in our system due to the non-constant temperature distribution along the strip. FIGS. 14A and 14B show that the deflections measured near the free end (empty markers) are smaller than the solid line following the quadratic fitting of the deflection measured near the base of the bimetallic strip. FIGS. 14A and 14B further reveal that the deflections near the free end of the bimetallic strip are linear. The exact correlation between the beam deflection and its temperature distribution will be useful for understanding the Galinstan drop's motion within the passive thermal switch disclosed herein.

To establish a relationship between base-heating and deflection of the bimetallic strip, Eq. 13 above was solved for the only unknown to determine a value of convection coefficient h=12.4 W/m²K. Using the beam theory for a cantilever under the influence of a thermally induced bending moment, the deflection of the bimetallic strip along its length x may be expressed as Eq. (14):

$$v_{(x)} = \frac{\alpha \theta_b}{m^2 s}(e^{-mx} + mx - 1) \qquad \text{Eq. (14)}$$

Figure 15:
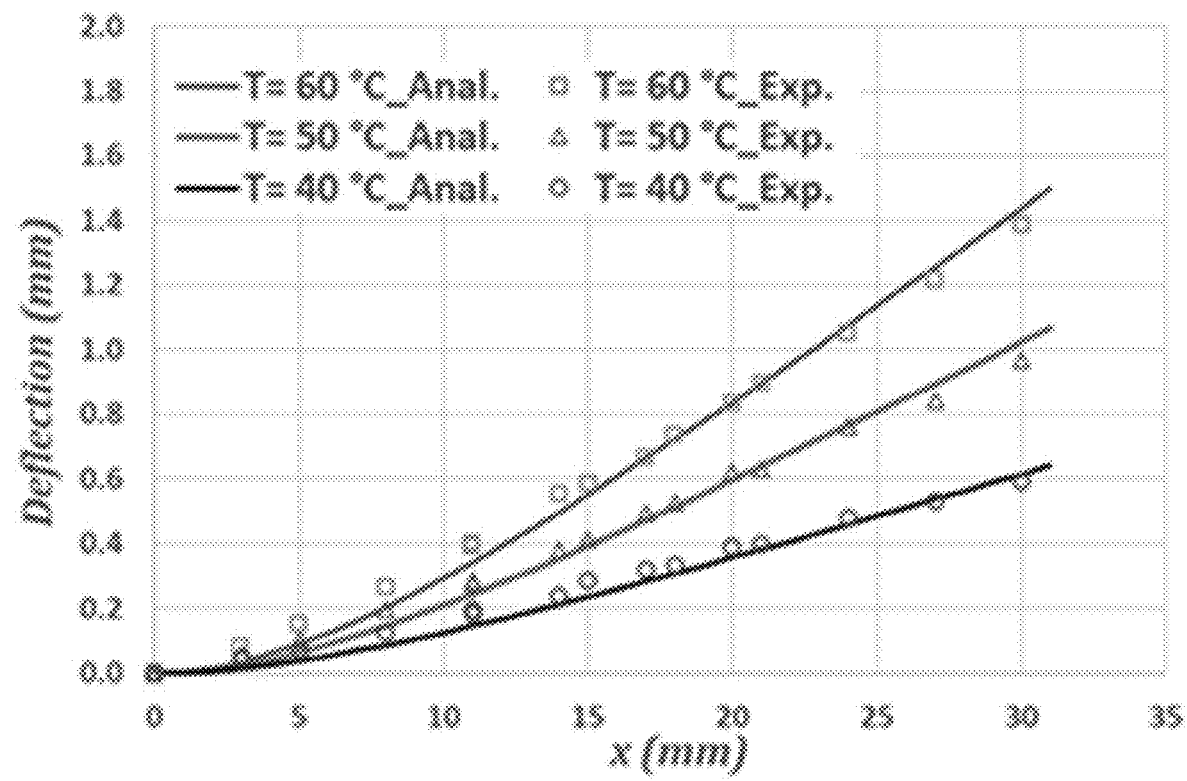
FIG. 15 is a graph comparing the experimentally measured and model-predicted deflections of a bimetallic strip heated to three different temperatures.

This deflection ultimately leads to the motion of the liquid metal drop within the passive thermal switch. FIG. 15 compares the experimentally measured deflection of the bimetallic strip heated to three set point temperatures to the deflections predicted by Eq. (14). This analysis determined that the specific deflection of the bimetallic strip was $\alpha = 10.67 \times 10^{-5}$ K$^{-1}$ for the non-uniform thermal distribution described above. The exact deflections along the bimetallic strip enhance understanding of the Laplace pressure gradient generated in the liquid metal resulting from such deflection within the thermal switch disclosed herein.

Example 5

Deflection of Heated Bimetallic Strip Exposed to Liquid Metal Pressure

To characterize the deflection of the bimetallic strip actuator of the passive thermal switch disclosed herein in the context of producing Laplacian pressure differentials in the liquid metal drop, the following experiments were conducted.

Figure 16:
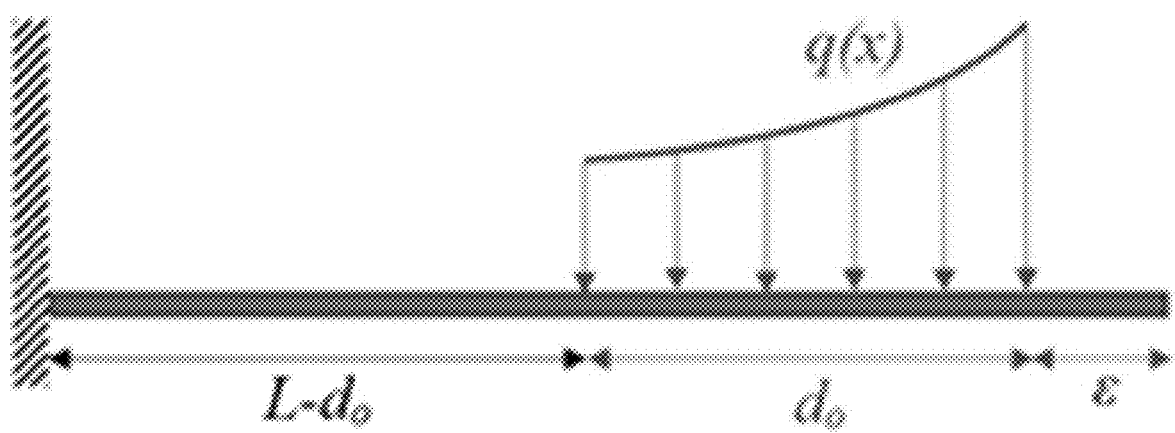
FIG. 16 is a schematic illustration showing a fixed beam problem corresponding to a bimetallic strip experiencing an opposing load force (Laplace pressure) from a liquid metal drop.

The actuation system of the passive thermal switch disclosed herein relies on the bending of a bimetallic strip upon a change in temperature to move a liquid metal (Galinstan) plug between a thermally conductive state and thermally non-conductive state configurations. The bending bimetallic strip encounters an opposition force load from the liquid metal drop which originates from its internal Laplace pressure and increases along the length of the liquid metal drop. This configuration can be translated to a fixed beam problem, illustrated schematically in FIG. 16, experiencing a load force of $$q(x) \approx \frac{2\gamma W \cos(\pi - \beta)}{t_o - v_{(x)}},$$

where β is the contact angle of the liquid drop and $t_o$ is the channel thickness.

Figure 17A:
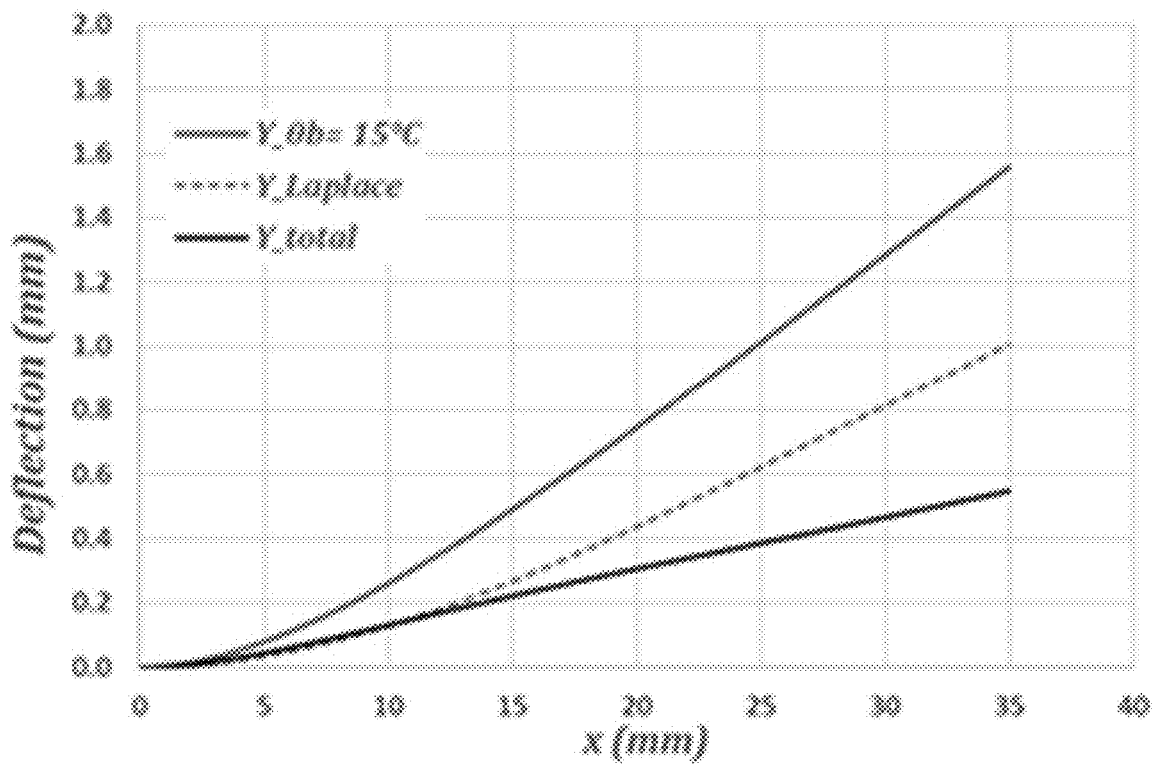
FIG. 17A is a graph summarizing the deflection estimated for a 35 mm long bimetallic strip heated by 15° C. for a non-uniform (Eq. (13)) temperature distribution. The red line denotes the deflection caused by the temperature change, the dashed blue line denotes the deflection of a liquid metal drop opposition force load (negative deflection; shown positive for clarity), and the black line denotes the net displacement due to the combined effects of temperature change and opposition force from the liquid metal drop. The liquid metal drop was assumed to be positioned between x=20 mm and 30 mm (i.e., do=10 mm, ε=5 mm).
Figure 17B:
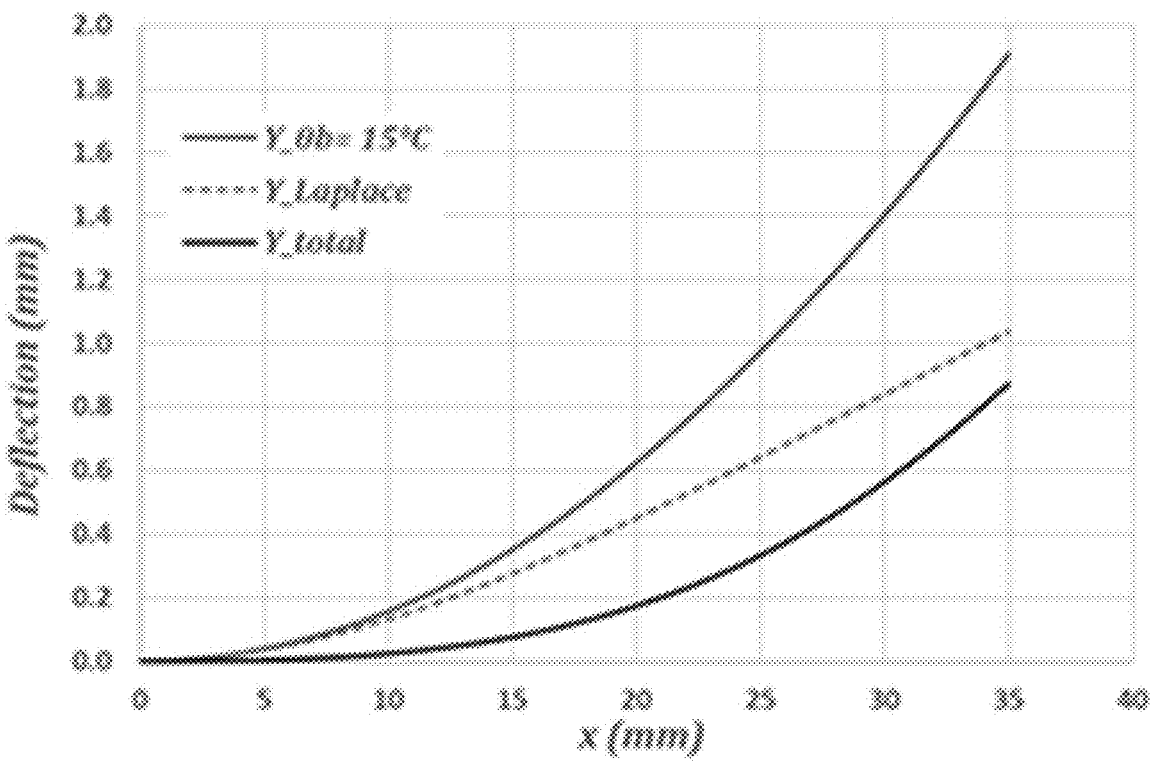
FIG. 17B is a graph summarizing the deflection estimated for the 35 mm long bimetallic strip of FIG. 17A heated by 15° C. for a uniform temperature distribution; lines on the graph are annotated similarly to the lines of FIG. 17A.

Although Eq. (14) may be used in the denominator of q(x), the exponential term quickly becomes so small with respect to x, such that it can be neglected and the problem can be solved analytically. Moreover, numerical simulations show that for an ideally insulated channel with vacuum, thermal convection is negligible and the bimetallic strip experiences a relatively uniform temperature change. For such a case, the classic solution of a uniform temperature bending of a bimetallic strip may be used. FIGS. 17A and 17B summarize the analytical solution for these cases when a bimetallic strip with total length of 35 mm experiences a 15° C. temperature increase (red line) as well as the deflection corresponding to the liquid metal opposition force load (blue dashed line). The final deflection, deduced by the method of superposition, is shown in black.

Example 6

Simulation of Liquid Metal Heat Switch

To validate the operation of the disclosed passive thermal switch, the following experiments were conducted.

Figure 18A:
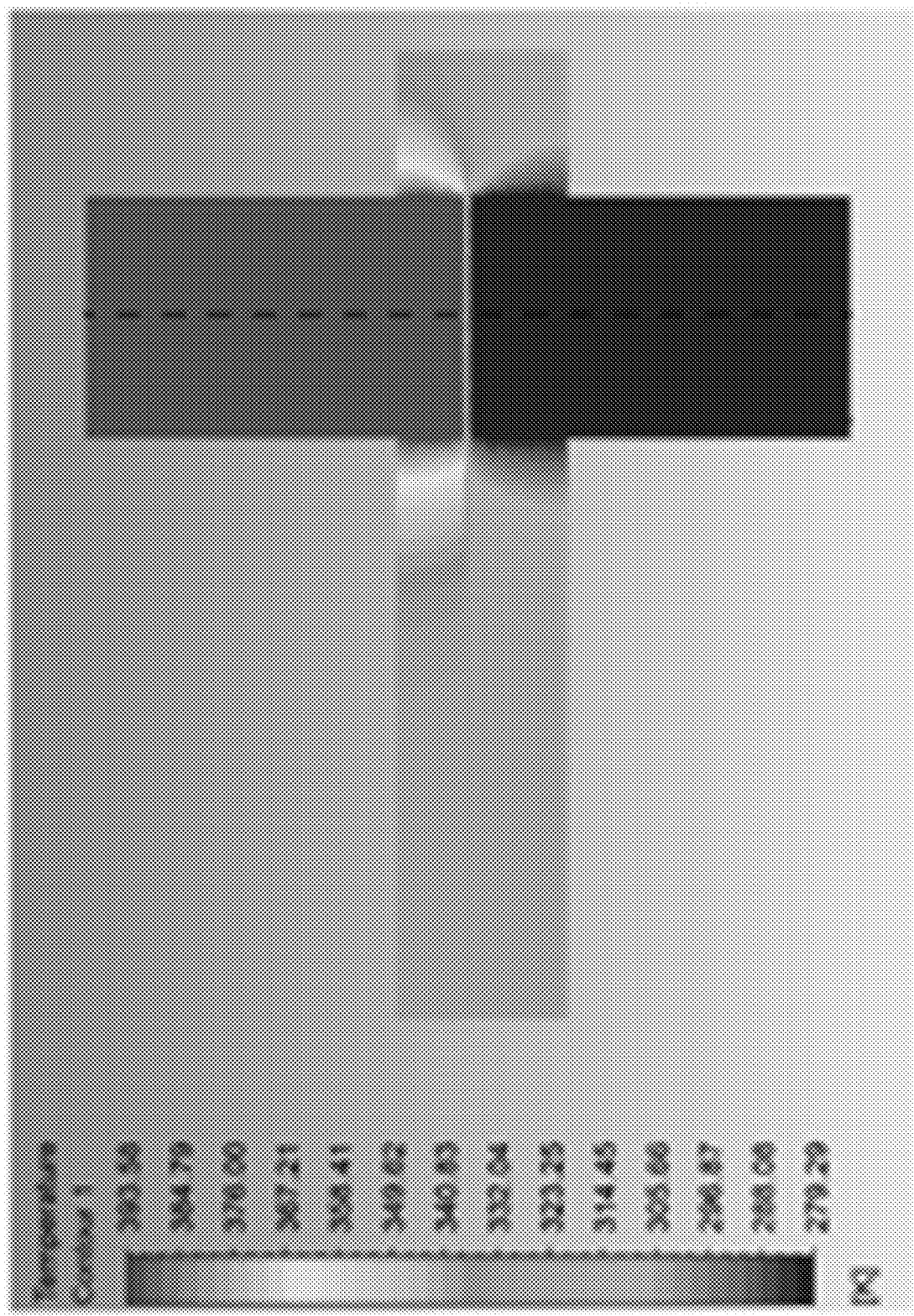
FIG. 18A is a simulated temperature contour at mid-plane for the OFF (thermally non-conductive) state of a passive thermal switch.
Figure 18B:
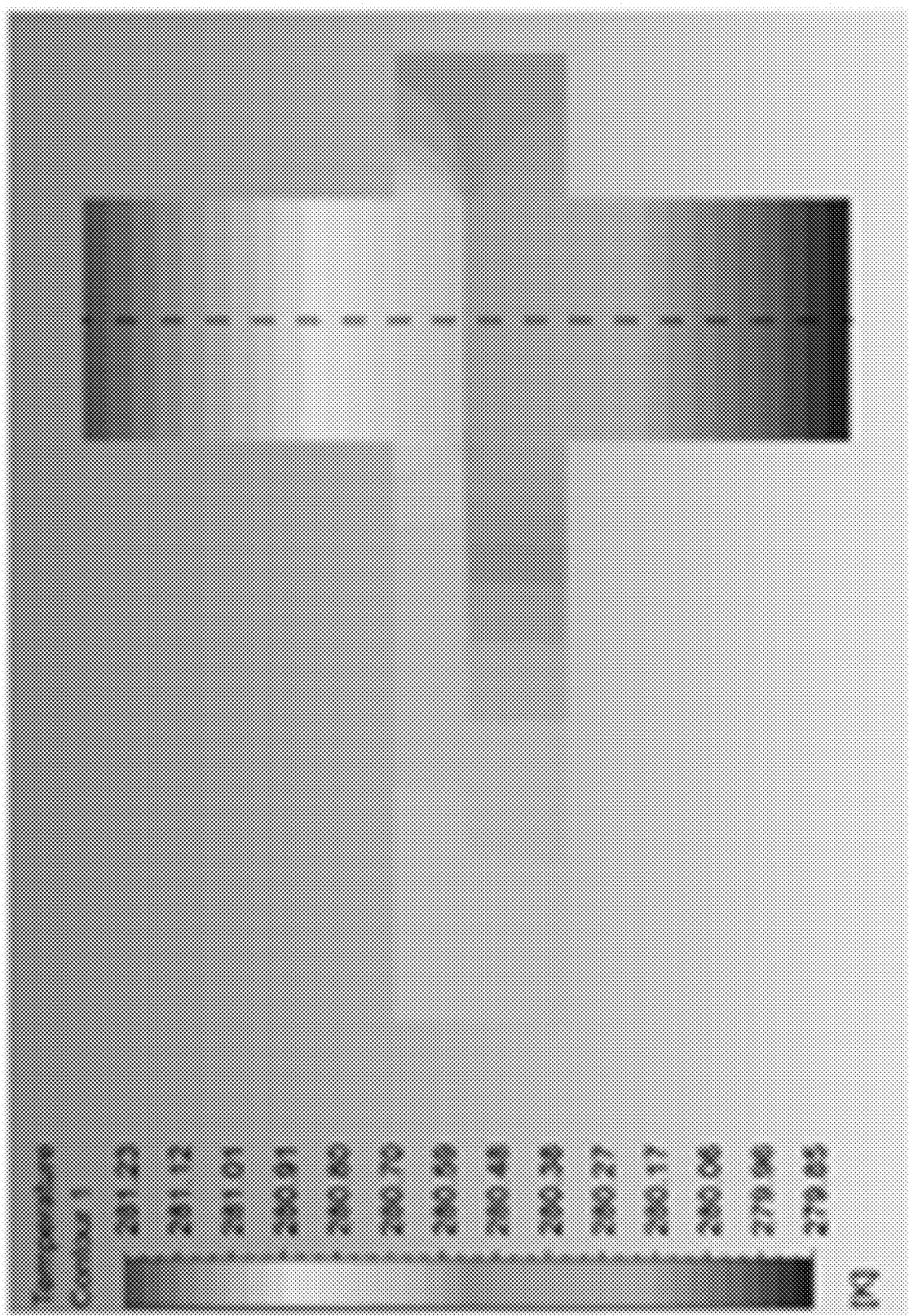
FIG. 18B is a simulated temperature contour at mid-plane for the ON (thermally conductive) state of a passive thermal switch.
Figure 18C:
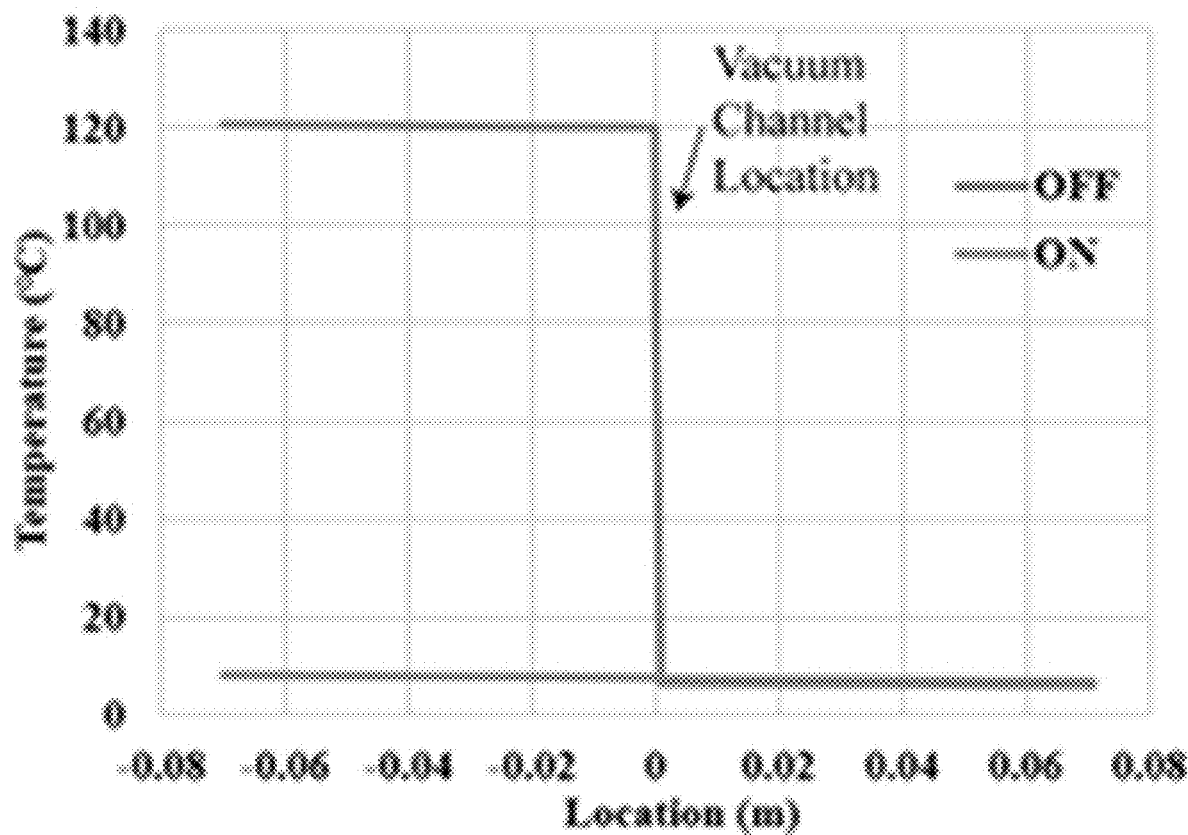
FIG. 18C is a graph summarizing simulated temperatures at the centerline (shown as dash line at FIGS. 18A and 18B for both thermally non-conductive state and thermally conductive state states of the passive thermal switch.

A full 3D simulation of the thermal setup was developed in Ansys Fluent. The preliminary results of the simulation, shown in FIGS. 18A, 18B, and 18C predict an ideal switching ratio of $\psi = R_{off}/R_{on} = 1758$.

Example 7

Performance of Liquid Metal Heat Switch

To validate the operation of the disclosed passive thermal switch, the following experiments were conducted.

The experiments were conducted using a thermal switch with an integrated actuation module with channel width W=30 mm, channel length L=35 mm, channel height at the fixed end of the bimetallic strip $h_0$=1.5 mm, channel height at the free end of the bimetallic strip $h_L$≈2.4 mm, and a strip deflection $v_L$≈3.2 mm at $T_{on}$. A Peltier (TeTech HP-127-1.4-2.5-72) was used to heat and cool the top conductor to assess the thermally non-conductive state-to-thermally conductive state and thermally conductive state-to-thermally non-conductive state movements of the bimetallic strip and liquid metal drop during a thermal cycle. For each thermal cycle, the Peltier heated the top conductor for 5 min and cooled down the conductor for 20 min after an inactivation period of one minute.

This heating/cooling procedure increased the temperature of the fixed end of the bimetallic by ~30° C. after 5 min of heating and then decreased its temperature to about ~5° C. below the initial starting temperature at the end of the cooling period. We experimentally measured the corresponding change in the profile of the bimetallic strip for this heating/cooling procedure and this change in the bimetallic profile was translated to the change in the channel height at the free end of the bimetallic strip.

Figure 3:
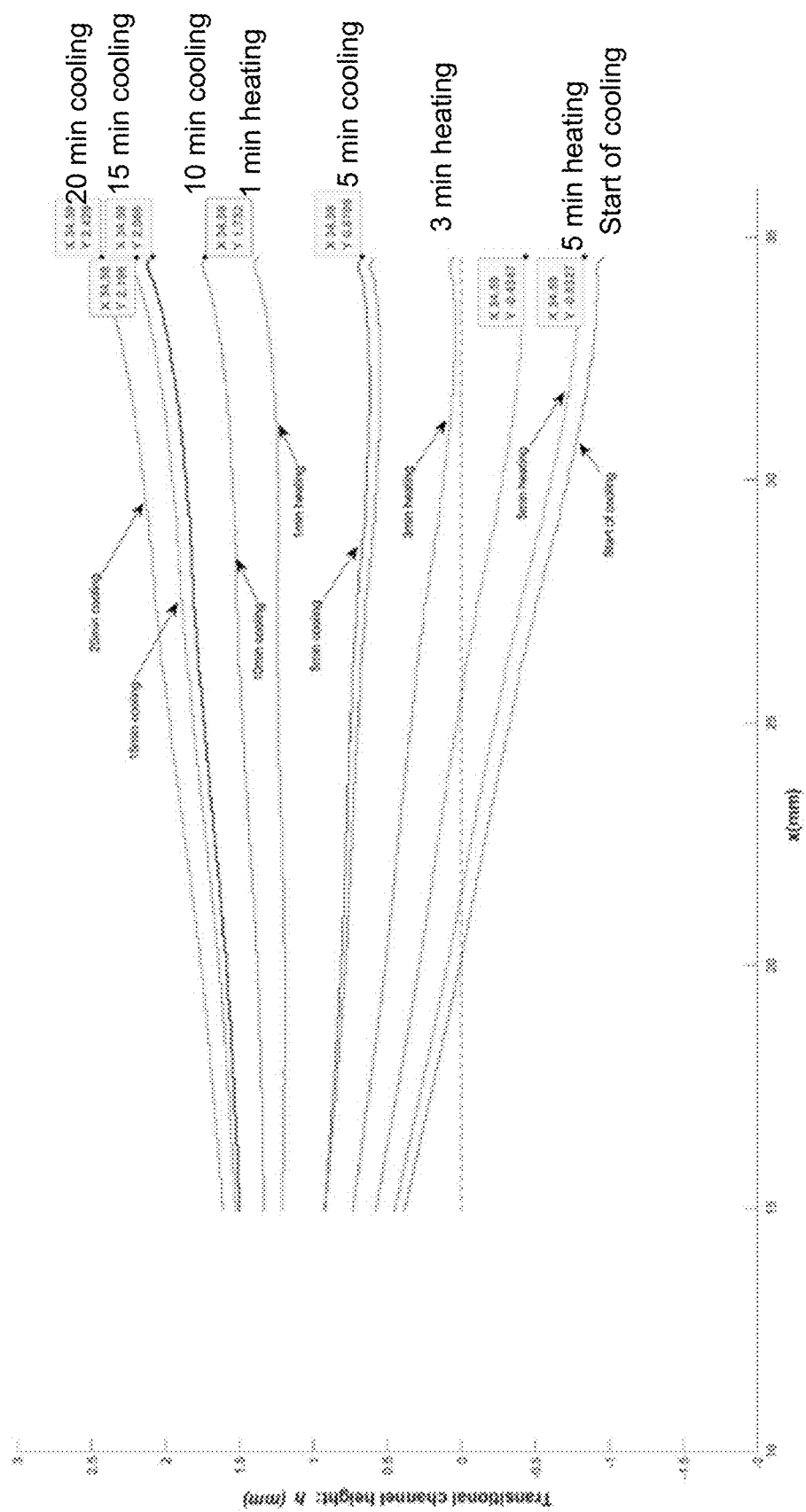
FIG. 3 is a graph summarizing the bending of the last 20 mm of the free end of the bimetallic for a heating/cooling process that actuates the Galinstan movement in the channel of the thermal switch. The fixed end of the bimetallic is attached to the copper conductor. The conductor is heated up for 5 min by a Peltier, then the Peltier turns off for 1 min, and then the Peltier cools down the conductor for 20 min. The solid black line shows the initial profile of the bimetallic. The red lines show the downward heat bending of the bimetallic for every 1 min during the 5 min heating period. The blue lines show the upward cool bending of the bimetallic for every 5 min during the cooling period. The black dash line represents the bottom of the channel.

FIG. 3 is a graph summarizing the observed deflection profiles of the bimetallic strip over a thermal cycle. The black line represents the initial bending of the bimetallic strip, and each red line illustrates the downward bending of the bimetallic for every 1 min during the 5 min heating process. The blue lines show the upward bending of the bimetallic for every 5 min during the 20 min cooling period. The black dashed line represents the bottom of the channel. The red lines corresponding to deflection profiles after 4 min and 5 min of heating indicate that the free end of the bimetallic strip would have deflected past the bottom of the channel, and therefore would provide extra heat bending force load needed to provide the necessary heating movement off the bimetallic strip as described above.

A thermal switch was formed with the dimensions described above with a Galinstan droplet. The movement of the Galinstan droplet within the thermal switch during a thermal cycle is shown in FIGS. 2A and 2B.

Example 8

Thermal Switch Prototype Testing

To evaluate the performance of the passive thermal switch described in Ex. 2, the following experiments were conducted.

Figure 19:
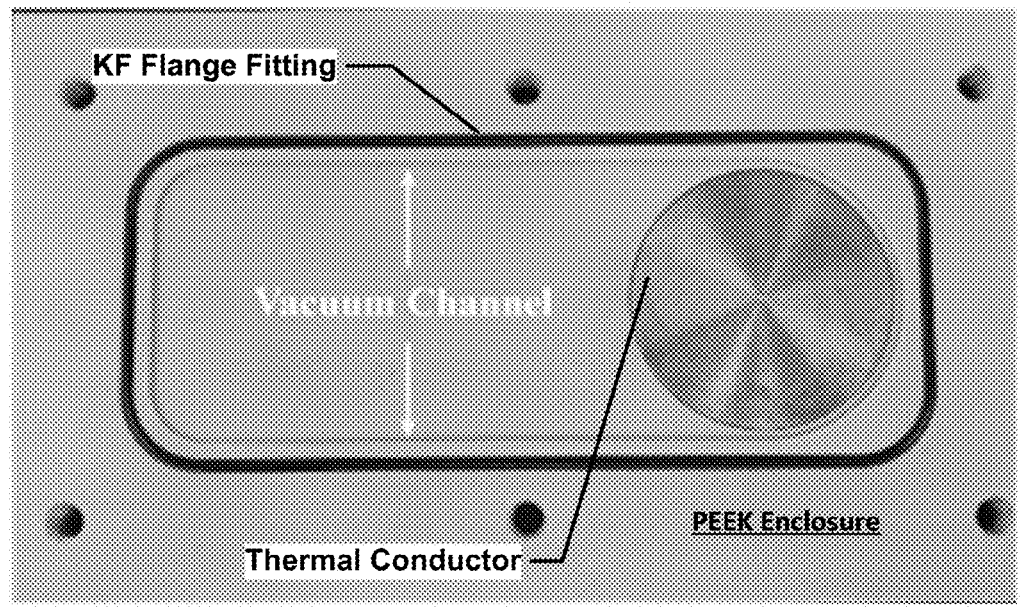
FIG. 19 is an image of a vacuum/Galinstan channel in one aspect.

Initially, a vacuum was applied to the channel of the passive thermal switch described in Ex. 2 to assess the vacuum seal of this design. The channel maintained a vacuum pressure of <1 Torr for only ~30 sec. To enhance the vacuum seal of the channel, a KF flange fitting was added to the original prototype design (see FIG. 19), providing the ability to hold a pressure of 0.02 Torr for 12 min. In addition, based on 3D numerical simulations, the width of the channel was also increased to reduce thermal leakage through the PEEK enclosure.

Figure 20:
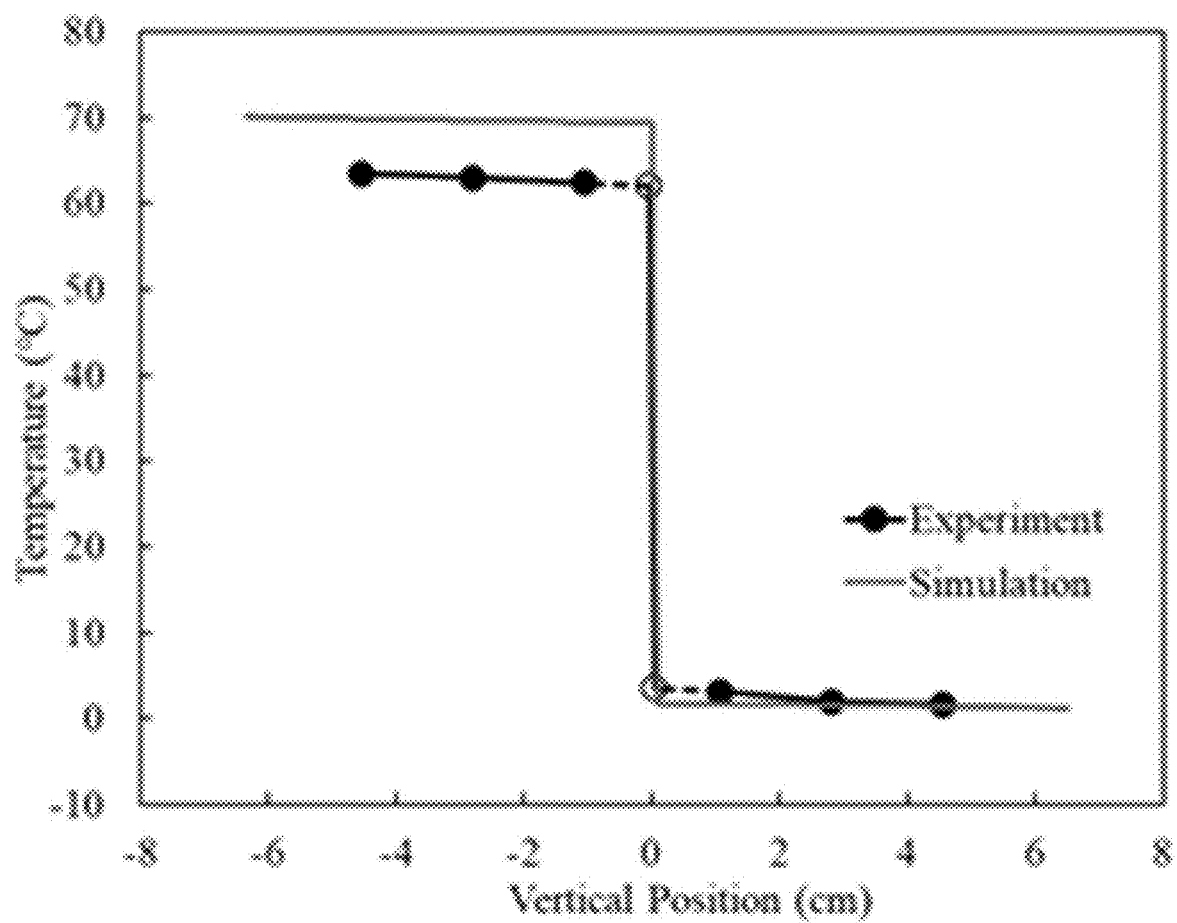
FIG. 20 is a graph summarizing the temperature profile through the conductors of a passive thermal switch: experimental (black) and simulation results (blue). The solid black circles show the measured temperature and the hollow circles are the extrapolated channel wall temperatures.

The modified thermal prototype was tested at the thermally non-conductive state without Galinstan in the channel. The vacuum pump was connected to ensure a stable vacuum pressure. The cooling side was integrated with a chiller output at 0° C., and the heating conductor was embedded with a cartridge heater (input voltage 30 V). The conductance of the prototype was determined to be $$C_{off} = \frac{Q}{\Delta T} = 0.106 \ W/K,$$

where Q=6.25 W was the total power input of the heater and ΔT=58.7 K was the measured temperature difference across the channel. However, the PEEK enclosure transferred significant thermal energy between the hot and cold sides. Simulation results estimated the heat flow through the channel itself as Q=1.87 W (30% of the total energy input), which should result in a conductance of $C_{off}$=0.032 W/K (see FIG. 20).

Example 9

Performance of Liquid Metal Heat Switch

To validate the performance of the passive thermal switch disclosed herein, the following experiments were conducted.

Thermal experiments were conducted by connecting a cold plate (−20° C.) or a hot plate (65° C.) to one of the conductors of the passive thermal switch disclosed herein (see FIGS. 4A and 4B) while leaving the other conductor exposed to the open lab environment (~24° C.). Stoppers were attached to the liquid metal channel to confine the position of the Galinstan droplet to achieve a full thermally conductive state/thermally non-conductive state during the thermal measurement. The temperature difference of the two conductors was measured by inserted RTD probes. The input heat flux of the heater was measured separately using a stainless-steel rod with the same diameter, heater input energy, and insulation method as the top copper conductor in the test. The thermally conductive state and thermally non-conductive state conductances were measured to be 2.14 W/K and 0.043 W/K. The switching ratio (thermally conductive state to thermally non-conductive state conductance ratio) of the thermal switch is calculated to be 50.

TABLE 1

Thermal measurement results of the thermal switch

| | $T_1$ (° C.) | $T_2$ (° C.) | Heat flux (W) | Conductance (W/K) |
|---|---|---|---|---|
| thermally conductive state | 62.14 | 59.94 | 4.71 | 2.14 |
| thermally non-conductive state | −16.42 | 13.78 | 1.30 | 0.043 |

What is claimed is:
1. A passive heat switch device, comprising:
 a. a casing comprising a pair of opposed lateral sides comprising an insulating material and opposed upper and lower sides, the lateral sides, upper side, and lower side defining a closed channel, the closed channel comprising a heat conducting region and an insulating region, wherein:
   i. the heat conducting region comprises a first portion of the upper and lower sides comprising a heat conducting material; and
   ii. the insulating region comprising a second portion of the upper and lower sides each comprising the insulating material;
 b. a passive thermal actuator thermally coupled to the first portion of the upper side and extending into the insu- lating region of the closed channel, the passive thermal actuator configured to deform when an actuator temperature of at least a portion of the passive thermal actuator falls within a switching temperature range defined between a minimum switching temperature and a maximum switching temperature; and c. a liquid slug positioned within the closed channel, the liquid slug contacting at least a portion of the passive thermal actuator and a portion of the lower side, the liquid slug configured to move along the closed channel in response to deformation of the passive thermal actuator, wherein the movement of the liquid slug ranges between the insulating region and the thermally conductive region of the closed channel over the switching temperature range.

2. The device of claim 1, wherein:
a. the position of the liquid slug is within the insulating region of the closed channel when the actuator temperature is above the maximum switching temperature and within the thermally conductive region when the actuator temperature is below the minimum switching temperature; or
b. the position of the liquid slug is within the insulating region of the closed channel when the actuator temperature is below the minimum switching temperature and within the thermally conductive region when the actuator temperature is above the maximum switching temperature.

3. The device of claim 1, wherein the passive thermal actuator comprises a bimetallic strip with opposed fixed and free ends, the fixed end thermally coupled to the first portion of the upper side and the free end positioned within the insulating region of the closed channel.

4. The device of claim 3, wherein deforming the bimetallic strip modulates a separation distance of the free end from the lower side of the closed channel relative to the separation distance of an undeformed bimetallic strip.

5. The device of claim 4, wherein:
a. deforming the bimetallic strip moves the free end upward from the lower side of the closed channel and increases the separation distance; or
b. deforming the bimetallic strip moves the free end downward toward the lower side of the closed channel and decreases the separation distance.

6. The device of claim 5, wherein deforming the bimetallic strip induces a Laplace pressure differential on the liquid slug, causing movement of the liquid slug along the closed channel.

7. The device of claim 1, wherein the heat conducting materials of the first portion of the upper and lower sides are thermally isolated when the liquid slug is positioned in the insulating region of the channel.

8. The device of claim 1, wherein the heat conducting materials of the first portion of the upper and lower sides are thermally coupled when the liquid slug is positioned in the heat conducting region of the channel.

9. The device of claim 1, wherein:
a. a heat source is coupled to the heat conducting material of the first portion of the upper side, a heat sink is thermally coupled to the heat conducting material of the first portion of the lower side, or any combination thereof; or
b. a heat source is coupled to the heat conducting material of the first portion of the lower side, a heat sink is thermally coupled to the heat conducting material of the first portion of the upper side, or any combination thereof.

10. The device of claim 1, wherein the insulating material comprises an insulating polymer, an insulating ceramic, or any combination thereof.

11. The device of claim 10, wherein the insulating material comprises polyetheretherketone (PEEK), an acrylic, an alumina ceramic, a zirconia ceramic, and any combination thereof.

12. The device of claim 1, wherein the heat conducting material comprises a metal, a thermally conductive ceramic, graphite, and any combination thereof.

13. The device of claim 12, wherein the metal is selected from copper, aluminum, silver, gold, iron, magnesium, zinc, tungsten, molybdenum, steel, and any combination or alloy thereof.

14. The device of claim 12, wherein the thermally conductive ceramic is selected from Shapal, Boron Nitride, and any combination thereof.

15. The device of claim 1, wherein the liquid slug comprises a material with a melting point below a minimum operating temperature of the passive heat switch device.

16. The device of claim 15, wherein the liquid slug comprises a liquid metal.

17. The device of claim 15, wherein the liquid metal is selected from mercury, gallium, a gallium alloy, an indium alloy, a bismuth-based metal, and any combination thereof.

18. The device of claim 8, wherein the liquid metal is selected from Galinstan, EGaIn, gallium, and mercury.

19. The device of claim 1, wherein the closed channel is evacuated to a vacuum.

20. The device of claim 1, wherein each surface of the insulating lateral sides, upper and lower sides, and passive thermal actuator contacting the liquid slug are coated with Teflon.

* * * * *